US007075168B2

(12) United States Patent
Sugiyama et al.

(10) Patent No.: US 7,075,168 B2
(45) Date of Patent: Jul. 11, 2006

(54) SEMICONDUCTOR DEVICE

(75) Inventors: Koichi Sugiyama, Saitama (JP);
Tomoki Inoue, Tokyo (JP); Hideaki Ninomiya, Kanagawa (JP); Masakazu Yamaguchi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/016,810

(22) Filed: Dec. 21, 2004

(65) Prior Publication Data

US 2005/0161768 A1  Jul. 28, 2005

(30) Foreign Application Priority Data

Dec. 25, 2003  (JP) ............................. 2003-429741

(51) Int. Cl.
*H01L 27/102*  (2006.01)
(52) U.S. Cl. .................. 257/566; 257/586; 257/107
(58) Field of Classification Search ...................... None
See application file for complete search history.

(56) References Cited

U.S. PATENT DOCUMENTS

| 6,153,896 | A | 11/2000 | Omura et al. ............... 257/139 |
| 6,188,109 | B1* | 2/2001 | Takahashi ................... 257/355 |
| 6,323,717 | B1 | 11/2001 | Omura et al. ............... 327/434 |
| 6,809,349 | B1 | 10/2004 | Yamaguchi et al. ........ 257/133 |

FOREIGN PATENT DOCUMENTS

JP  2000-101076  4/2000

OTHER PUBLICATIONS

Ichiro Omura, et al., "IEGT design concept against operation instability and its impact to application", ISPD 2000, May 22-25, 2000, pp. 25-28.

* cited by examiner

*Primary Examiner*—Tu-Tu Ho

(74) *Attorney, Agent, or Firm*—Oblon, Spivak, McClelland, Maier & Neustadt, P.C.

(57) ABSTRACT

A semiconductor device comprises a first base layer of a first conductive type which has a first surface and a second surface; a second base layer of a second conductive type which is formed on the first surface; first and second gate electrodes which are formed by embedding an electrically conductive material into a plurality of trenches via gate insulating films, the plurality of trenches being formed such that bottoms of the trenches reach the first base layer; source layers of the first conductive type which are formed on a surface area of the second base layer so as to be adjacent to both side walls of the trench provided with the first gate electrode and one side wall of the trench provided with the second gate electrode, respectively; an emitter layer of the second conductive type which is formed on the second surface; emitter electrodes which are formed on the second base layer and the source layers; a collector electrode which is formed on the emitter layer; and first and second terminals which are electrically connected to the first and second gate electrodes, respectively.

16 Claims, 25 Drawing Sheets

11···n-TYPE BASE LAYER
12···p-TYPE BASE LAYER
13···TRENCH
14···GATE INSULATING FILM
15···FIRST GATE ELECTRODE($G_1$)
16a,16b···SECOND GATE ELECTRODE($G_2$)
17···n-TYPE SOURCE LAYER
18···EMITTER ELECTRODE
19···INSULATING FILM
20···p-TYPE EMITTER LAYER
21···COLLECTOR ELECTRODE
36···CONTROLLER

11···n-TYPE BASE LAYER
12···p-TYPE BASE LAYER
13···TRENCH
14···GATE INSULATING FILM
15···FIRST GATE ELECTRODE($G_1$)
16a,16b···SECOND GATE ELECTRODE($G_2$)
17···n-TYPE SOURCE LAYER
18···EMITTER ELECTRODE
19···INSULATING FILM
20···p-TYPE EMITTER LAYER
21···COLLECTOR ELECTRODE
36···CONTROLLER

15···FIRST GATE ELECTRODE($G_1$)
16a,16b···SECOND GATE ELECTRODE($G_2$)
18a···EMITTER CONTACT
25···FIRST GATE WIRE
26···SECOND GATE WIRE

15···FIRST GATE ELECTRODE($G_1$)
16a,16b···SECOND GATE ELECTRODE($G_2$)
24···SEMICONDUCTOR SUBSTRATE
25···FIRST GATE WIRE
26···SECOND GATE WIRE
27, 28···GATE ELECTRODE TAKING-OUT SECTION

18···EMITTER ELECTRODE
21···COLLECTOR ELECTRODE
31···FIRST GATE RESISTOR
32···SECOND GATE RESISTOR
33···FIRST TERMINAL
34···SECOND TERMINAL
36···CONTROLLER
36a···CONTROL UNIT FOR A FIRST GATE ELECTRODE($G_1$)
36b···CONTROL UNIT FOR A SECOND GATE ELECTRODE($G_2$)

18···EMITTER ELECTRODE
21···COLLECTOR ELECTRODE
31···FIRST GATE RESISTOR
32···SECOND GATE RESISTOR
33···FIRST TERMINAL
34···SECOND TERMINAL
36···CONTROLLER
36c···COMMON CONTROL UNIT
36d···DELAY UNIT

15···FIRST GATE ELECTRODE(G$_1$)
16a, 16b···SECOND GATE ELECTRODE(G$_2$)
18a···EMITTER CONTACT
25···FIRST GATE WIRE
26···SECOND GATE WIRE

10···SEMICONDUCTOR LAYER
15···FIRST GATE ELECTRODE($G_1$)
16b···SECOND GATE ELECTRODE($G_2$)
18···EMITTER ELECTRODE
19···INSULATING FILM
25···FIRST GATE WIRE
26···SECOND GATE WIRE

11···n-TYPE BASE LAYER
12···p-TYPE BASE LAYER
13···TRENCH
14···GATE INSULATING FILM
15···FIRST GATE ELECTRODE($G_1$)
16a, 16b···SECOND GATE ELECTRODE($G_2$)
17···n-TYPE SOURCE LAYER
18···EMITTER ELECTRODE
19···INSULATING FILM
20···p-TYPE EMITTER LAYER
21···COLLECTOR ELECTRODE
36···CONTROLLER

18···EMITTER ELECTRODE
21···COLLECTOR ELECTRODE
31···FIRST GATE RESISTOR
32···SECOND GATE RESISTOR
33···FIRST TERMINAL
34···SECOND TERMINAL
36···CONTROLLER
36a···CONTROL UNIT FOR A FIRST GATE ELECTRODE($G_1$)
36b···CONTROL UNIT FOR A SECOND GATE ELECTRODE($G_2$)

11···n-TYPE BASE LAYER
12···p-TYPE BASE LAYER
13, 42···TRENCH
14···GATE INSULATING FILM
15···FIRST GATE ELECTRODE($G_1$)
16a, 16b···SECOND GATE ELECTRODE($G_2$)
17···n-TYPE SOURCE LAYER
18, 41···EMITTER ELECTRODE
19···INSULATING FILM
20···p-TYPE EMITTER LAYER
21···COLLECTOR ELECTRODE

11···n-TYPE BASE LAYER
12···p-TYPE BASE LAYER
13, 42···TRENCH
14···GATE INSULATING FILM
15···FIRST GATE ELECTRODE($G_1$)
16a, 16b···SECOND GATE ELECTRODE($G_2$)
17···n-TYPE SOURCE LAYER
18, 41···EMITTER ELECTRODE
19···INSULATING FILM
20···p-TYPE EMITTER LAYER
21···COLLECTOR ELECTRODE

51···n-TYPE BASE LAYER
52···p-TYPE BASE LAYER
53···n-TYPE SOURCE LAYER
54···GATE INSULATING FILM
55···FIRST GATE ELECTRODE($G_1$)
56···SECOND GATE ELECTRODE($G_2$)
57···EMITTER ELECTRODE
58···INSULATING FILM
59···p-TYPE EMITTER LAYER
60···COLLECTOR ELECTRODE

55···FIRST GATE ELECTRODE($G_1$)
56···SECOND GATE ELECTRODE($G_2$)
57a···EMITTER CONTACT
65···FIRST GATE WIRE
66···SECOND GATE WIRE

55⋯FIRST GATE ELECTRODE($G_1$)
56⋯SECOND GATE ELECTRODE($G_2$)
64⋯SEMICONDUCTOR SUBSTRATE
65⋯FIRST GATE WIRE
66⋯SECOND GATE WIRE
67, 68⋯GATE ELECTRODE TAKING-OUT SECTION

57···EMITTER ELECTRODE
60···COLLECTOR ELECTRODE
71···FIRST GATE RESISTOR
72···SECOND GATE RESISTOR
73···FIRST TERMINAL
74···SECOND TERMINAL
76···CONTROLLER
76a···CONTROL UNIT FOR A FIRST GATE ELECTRODE($G_1$)
76b···CONTROL UNIT FOR A SECOND GATE ELECTRODE($G_2$)

57···EMITTER ELECTRODE
60···COLLECTOR ELECTRODE
71···FIRST GATE RESISTOR
72···SECOND GATE RESISTOR
73···FIRST TERMINAL
74···SECOND TERMINAL
76···CONTROLLER
76c···COMMON CONTROL UNIT
76d···DELAY UNIT

51⋯n-TYPE BASE LAYER
52⋯p-TYPE BASE LAYER
53⋯n-TYPE SOURCE LAYER
54⋯GATE INSULATING FILM
55⋯FIRST GATE ELECTRODE($G_1$)
56⋯SECOND GATE ELECTRODE($G_2$)
57⋯EMITTER ELECTRODE
58⋯INSULATING FILM
59⋯p-TYPE EMITTER LAYER
60⋯COLLECTOR ELECTRODE

55···FIRST GATE ELECTRODE($G_1$)
56···SECOND GATE ELECTRODE($G_2$)
57a···EMITTER CONTACT
65···FIRST GATE WIRE
66···SECOND GATE WIRE

50···SEMICONDUCTOR LAYER
54···GATE INSULATING FILM
55···FIRST GATE ELECTRODE($G_1$)
56···SECOND GATE ELECTRODE($G_2$)
57···EMITTER ELECTRODE
58···INSULATING FILM
65···FIRST GATE WIRE
66···SECOND GATE WIRE

51⋯n-TYPE BASE LAYER
52⋯p-TYPE BASE LAYER
53⋯n-TYPE SOURCE LAYER
54⋯GATE INSULATING FILM
55⋯FIRST GATE ELECTRODE($G_1$)
56⋯SECOND GATE ELECTRODE($G_2$)
57⋯EMITTER ELECTRODE
58⋯INSULATING FILM
59⋯p-TYPE EMITTER LAYER
60⋯COLLECTOR ELECTRODE

57···EMITTER ELECTRODE
60···COLLECTOR ELECTRODE
71···FIRST GATE RESISTOR
72···SECOND GATE RESISTOR
75···THIRD TERMINAL
76···CONTROLLER
76c···COMMON CONTROL UNIT
76d···DELAY UNIT

81⋯THIRD GATE RESISTOR

SEMICONDUCTOR DEVICE

CROSS-REFERENCE TO RELATED APPLICATION

This application is based upon and claims the benefit of priority from the prior Japanese Patent Applications No. 2003-429741, filed on Dec. 25th, 2003, the entire contents of which are incorporated herein by reference.

BACKGROUND OF THE INVENTION

1. Field of the Invention

The present invention relates to a semiconductor device including an insulated-gate semiconductor element such as an IEGT.

2. Description of the Related Art

In order to utilize power energy effectively, power converting apparatuses such as a converter or an inverter using a power semiconductor device are widely used. As the power semiconductor device, such an insulated-gate semiconductor device as an IEGT (Injection Enhanced Gate Bipolar Transistor) or an IGBT (Insulated Gate Bipolar Transistor) is used. The IEGT or IGBT allows size-reduction of peripheral circuits such as a control circuit or a protective circuit and can achieve a low loss, a high speed and a low cost. Here, an IGBT obtained by performing such a treatment as thinning contacts for an emitter electrode to enhance electron injection is called "the IEGT".

In an IEGT having a trench gate structure described in Japanese Patent Application Laid-open No. 10-321856 (JP-A), refer to a description from pages 3 to 7, FIG. 59, and FIG. 64) (Patent Literature 1) and "IEGT design concept against operation instability and its impact to application", by Ichiro Omura, et al, Proceedings of the International Symposium on Power Semiconductor Devices & ICs (ISPSD 2000), (US), IEEE, May, 2000, p. 25 to 28) (Non-Patent Literature 2), a p-type base layer is formed on a first face of a n-type base layer. A plurality of trenches extending from the p-type base layer to the n-type base layer are formed. The trenches are formed such that their bottom portions reach inside of the n-type base layer. Gate electrodes are formed by embedding conductive layers into the trenches via gate-insulating films. A unit cell contains two gate electrodes. A n-type source layer is formed on a surface region of the p-type base layer between the two gate electrodes so as to come in contact with one side walls of the respective trenches. That is, the n-type source layer is formed so as to come in contact with the respective gate electrodes via the gate-insulating film. Here, the other side walls of the trenches are not formed with a n-type source layer. Here, a common emitter electrode is formed on the p-type base layer and the n-type source layer.

On the other hand, a p-type emitter layer is formed on a second surface of the n-type base layer. A collector electrode is formed on the p-type emitter layer. A plurality of unit cells thus formed are respectively connected in parallel.

Next, an operation method of the IEGT formed in this manner will be described. When a voltage forming a positive voltage relative to the emitter electrode is applied to the collector electrode and a voltage forming a positive voltage relative to the emitter electrode is applied to the gate electrode, the IEGT is turned on to be put in a conductive state. That is, when a positive voltage is applied to the gate electrode, a channel for electrons is first formed in the p-type base layer between the n-type base layer and the n-type source layer, and an electron current flows from the n-type source layer to the n-type base layer. Further, a hole current flows from the p-type emitter layer to the n-type base layer. Thereby, conduction modulation takes place in the n-type base layer and the IEGT turns on to become electrically conductive.

Here, such a constitution is employed that a contact portion connecting to the emitter electrode is not formed on the surface region of the p-type base layer which is not formed with an n-type source layer, which results in thinning contact portions for an emitter electrode. With such formation, holes are accumulated in the n-type base layer in an electrically conductive state so that an effect of conductive modulation is increased, which can achieve reduction in ON-state voltage.

On the other hand, by applying, to the gate electrode, such a voltage forming 0 or a negative voltage relative to the emitter electrode, the IEGT is turned OFF to be put in a blocking state. By applying, to the gate electrode, such a voltage forming 0 or a negative voltage relative to the emitter electrode, the n-type channel formed in the p-type base layer varnishes to stop injection of electron current from the n-type source layer to the n-type base layer. As a result, the IEGT turns OFF to enter in a blocking state.

JP-A-2000-101076, refer to a description from page 3 to page 4 and FIG. 1, discloses a semiconductor device which supplies different control signals to gate electrodes constituting such a unit cell.

Each of the Patent Literature 1 and Non-Patent Literature 2 also describes an IEGT having a planar gate structure different from the above-described trench gate structure. In the IEGT, a p-type base layer is formed on a surface region of a first surface side of an n-type base layer. Further, an n-type source layer is formed on a surface region of a p-type base layer. A gate electrode is formed on the n-type base layer and the p-type base layer via a gate insulating film. A unit cell contains one gate electrode. A common emitter electrode is formed on the p-type base layer and the n-type source layer. On the other hand, a p-type emitter layer is formed on a second surface of the n-type base layer. A collector electrode is formed on the p-type emitter layer.

The IEGT having such a planar gate structure is constituted such that a contact portion of the emitter electrode is substantially thinned by setting a gate electrode width sufficiently largely. With such formation, holes can be accumulated in the n-type base layer in a conductive state and an effect of conductive modulation can be increased, so that an ON-state voltage can be reduced. Operations of the IEGT having the planar gate structure at a turn-on time and at a turn-off time are substantially similar to those of the IEGT having the trench gate structure.

In each of an IEGT with such a trench gate structure and an IEGT with such a planar gate structure, when the IEGT is turned on in a state of application of a high voltage to the collector electrode, holes injected from the p-type emitter layer are accelerated by a high electric field in the n-type base layer to reach an interface between the n-type base layer at the portion where the contacts for the emitter electrode have been thinned and the gate insulating film. When a high voltage is applied to the collector electrode, a channel of holes is formed in an interface of the n-type base layer, because the potential of the n-type base layer is higher than the potential of the gate electrode. Negative charges are induced in the gate electrode by the channel of holes, so that a negative differential capacitance ($C_G=dQ_G/dV_G$) occurs in the gate electrode. Here, $Q_G$ indicates charges accumulated in the gate electrode. The negative differential capacitance is hereinafter called "a negative capacitance". When a gate resistance is connected to the gate electrode, a current flowing due to the negative capacitance causes a voltage drop via the gate resistance, which results in rising of a gate voltage $V_G$. When the gate voltage VG rises, a collector current flows urgently, so that a turn-on action of the IEGT becomes unstable. When the IEGT is turned off, a capacitance component in a parasitic LCR circuit changes to a negative capacitance. As a result, the IEGT may be oscillated in some cases, so that a turn-off action of the IEGT becomes unstable.

In the IEGT with the trench gate structure, therefore, the negative capacitance is reduced by connecting an electrode inside the trench which does not contribute to electron injection to the emitter electrode or shallowing trench gates. In the IEGT with the planar gate structure, the gate insulating film on the n-type base layer is formed so as to be thicker than the gate insulating film on the p-type base layer to reduce a parasitic capacitance, thereby decreasing the negative capacitance. However, because these structures eventually suppress a conductive modulation effect enhancing or promoting electron injection, it becomes difficult to further lower the ON-state voltage.

When the IEGT is turned ON in a state of application of a high voltage to the collector electrode, a channel of holes is formed in the n-type base layer at an interface of a portion where the contacts for the emitter electrode have been thinned and negative charges are induced in the gate electrode due to the channel of holes, so that a negative capacitance occurs in the gate electrode. Since the gate voltage VG rises due to occurrence of the negative capacitance, a collector current flows urgently. As a result, there occurs such a problem that the turn-on action of the IEGT becomes unstable. In addition, since, when the IEGT is turned off, the capacitance component in the parasitic LCR circuit changes to a negative capacitance, which may cause oscillation in the IEGT, there is such a problem that the turn-off action of the IEGT becomes unstable.

On the other hand, in the IEGT with the trench gate structure, the negative capacitance is reduced by connecting an electrode inside the trench, which does not contribute to electron injection, to the emitter electrode or shallowing trench gates. In the IEGT with the planar gate structure, the negative capacitance is reduced by forming the gate insulating film on the n-type base layer so as to be thicker than the gate insulating film on the p-type base layer to reduce the parasitic capacitance. However, since these structures eventually suppress the conduction modulation effect enhancing electron injection, there is such a problem that it is made difficult to further lower the ON-state voltage.

SUMMARY OF THE INVENTION

A semiconductor device according to an embodiment of the present invention comprises a first base layer of a first conductive type which has a first surface and a second surface; a second base layer of a second conductive type which is formed on the first surface; first and second gate electrodes which are formed by embedding an electrically conductive material into a plurality of trenches via gate insulating films, the plurality of trenches being formed such that bottoms of the trenches reach the first base layer; source layers of the first conductive type which are formed on a surface area of the second base layer so as to be adjacent to both side walls of the trench provided with the first gate electrode and one side wall of the trench provided with the second gate electrode, respectively; an emitter layer of the second conductive type which is formed on the second surface; an emitter electrode which is formed on the second base layer and the source layers; a collector electrode which is formed on the emitter layer; and first and second terminals which are electrically connected to the first and second gate electrodes, respectively.

A semiconductor device according to an embodiment of the present invention comprises a first base layer of a first conductive type which has a first surface and a second surface; a second base layer of a second conductive type which is formed on the first surface; first and second gate electrodes which are formed by embedding an electrically conductive material into a plurality of trenches via gate insulating films, the plurality of trenches being formed such that bottoms of the trenches reach the first base layer; source layers of the first conductive type which are formed on a surface area of the second base layer so as to be adjacent to both side walls of the trench provided with the first gate electrode and one side wall of the trench provided with the second gate electrode, respectively; an emitter layer of the second conductive type which is formed on the second surface; an emitter electrode which is formed on the second base layer and the source layers; a collector electrode which is formed on the emitter layer; and a third electrode connected electrically to the first and second gate electrodes.

A semiconductor device according to an embodiment of the present invention comprises a first base layer of a first conductive type which has a first surface and a second surface; a second base layer of a second conductive type which is formed on the first surface; a source layer of a first conductive type which is formed on a surface region of the second base layer; an emitter layer of the second conductive type which is formed on the second surface; a first gate electrode which is formed on the second base layer via a gate insulating layer; a second gate electrode which is formed on the first base layer via a gate insulating layer and is formed at a site apart from the first gate electrode; an emitter electrode which is formed on the second base layer and the source layer; and a collector electrode which is formed on the emitter layer.

BRIEF DESCRIPTION OF THE INVENTION

DETAILED DESCRIPTION OF THE INVENTION (First Embodiment)

Figure 1:
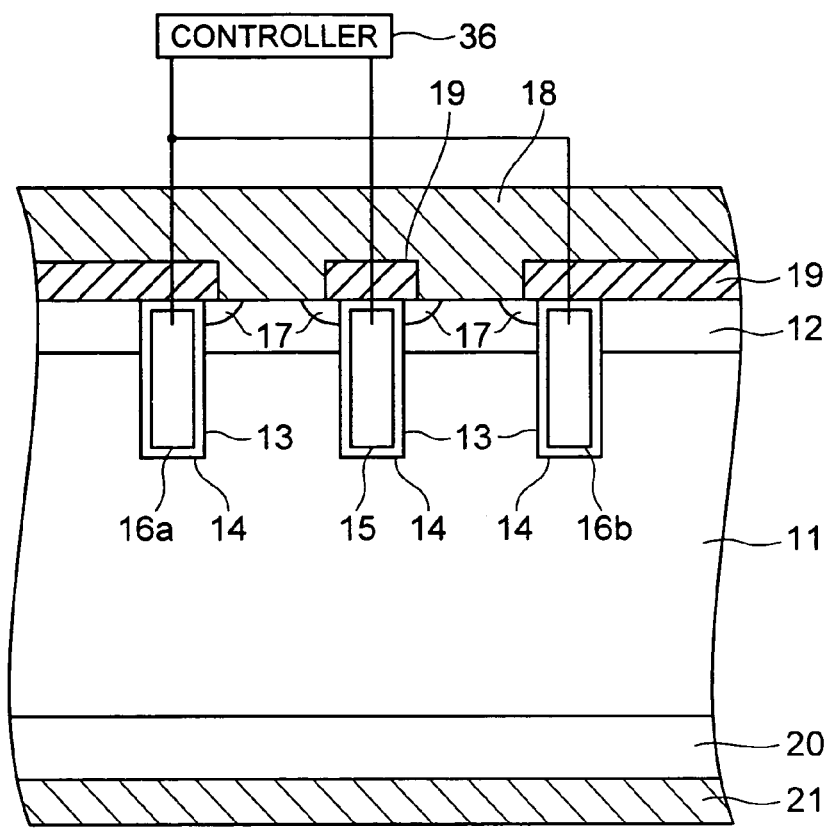
FIG. 1 is a sectional view of a semiconductor device according to a first embodiment of the present invention.

A semiconductor device according to a first embodiment of the present invention will be explained with reference to FIGS. 1 to 8. FIG. 1 is a sectional view of an IEGT having a trench gate structure in this embodiment. In the IEGT, as shown in FIG. 1, a p-type base layer 12 is formed on a first surface of an n-type base layer 11 formed of a semiconductor substrate. A plurality of trenches 13 are formed so as to extend from the p-type base layer 12 to the n-type base layer 11. The trenches 13 are formed such that their bottoms reach into the n-type base layer 11.

A first gate electrode ($G_1$) 15 and a plurality of second gate electrodes ($G_2$) 16a, 16b positioned about the first gate electrode 15 are formed by embedding conductive layers into the trenches 13 via gate insulating films 14. N-type source layers 17 are respectively formed on a surface region of the p-type base layer 12 positioned between the first gate electrode 15 and the second gate electrode 16a and between the first gate electrode 15 and the second gate electrode 16b. The n-type source layers 17 are respectively formed adjacent to the first gate electrode 15 and the second gate electrodes 16a, 16b via the gate insulating films 14. The first gate electrode 15 is formed such that the n-type source layers 17 are positioned adjacent to both side walls of the trench therefor, and the plurality of second gate electrodes 16a, 16b are formed such that the n-type source layers 17 are positioned adjacent to one side walls of the trenches therefor.

A common emitter electrode 18 is formed on the p-type base layer 12 and the n-type source layers 17. Insulating films 19 are formed on the first gate electrode ($G_1$) 15 and the second gate electrodes ($G_2$) 16a, 16b. On the other hand, a p-type emitter layer 20 is formed on a second surface of the n-type base layer 11. A collector electrode 21 is formed on the p-type emitter layer 20. In FIG. 1, a unit cell structure is shown but a plurality of unit cells thus constituted are arranged in parallel in an actual structure. The first and second gate electrodes 15, and , 16a, 16b are electrically connected with first and second terminals (not shown), respectively and the first and second terminals are further electrically connected to a controller 36 which controls first and second gate voltages.

When the IEGT is turned on in a state of application of a high voltage to the collector electrode, holes injected from the p-type emitter layer are accumulated in an interface of the n-type base layer at a portion where contacts for an emitter electrode have been thinned. A negative capacitance is produced due to induction of negative charges in the gate electrode. The insulating films 19 are formed on the first gate electrode 15 and the second gate electrodes 16a and 16b. Contact for an emitter electrode are formed on both sides of the insulating film 19 on the first gate electrode 15, namely, on one sides of the respective insulating films 19 on the second gate electrodes 16a, 16b. Thereby, holes are accumulated on side walls at the other sides of the second gate electrodes 16a, 16b and hole channels are formed, which results in facilitation of negative capacitance occurrence.

Figure 2:
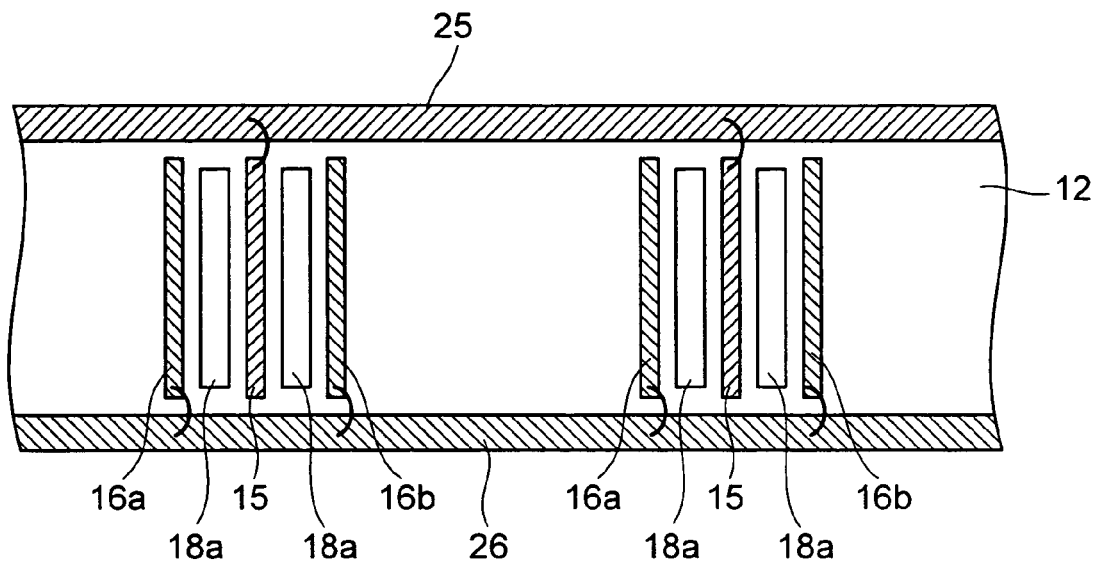
FIG. 2 is a plan view of a cell portion of the semiconductor device shown in FIG. 1.

FIG. 2 is a plan view of a cell portion of the semiconductor device shown in FIG. 1. The first gate electrode 15 and the second gate electrodes 16a and 16b are respectively connected to first and second gate wires 25 and 26 so as to be inputted with different control signals. Emitter electrode contacts 18a are formed between the first gate electrode 15 and the second gate electrode 16a and between the first gate electrode 15 and the second gate electrode 16b. The first gate wire 25 is arranged on one end sides of the first and second gate electrodes 15, 16a, 16b in longitudinal directions in which they extend in a vertical direction to the longitudinal directions. The second gate wire 26 is arranged on the other end sides of the first and second gate electrode 15, 16a, 16b in the longitudinal directions. That is, the first gate wire 25 connected to the first gate electrode 15 is arranged on an upper side of the first and second gate electrodes 15, 16a, 16b on FIG. 2. The second gate wire 26 connected to the second gate electrodes 16a, 16b is arranged on a lower side of the first and second gate electrodes 15, 16a, 16b on FIG. 2. The gate electrodes and the gate wires may be connected mutually by extending end portions of the gate electrodes or end portions of the gate wires, or they may be connected mutually using connection members. Alternatively, such a constitution may be employed that the first and second gate wires 25, 26 are arranged in parallel and on one end sides, in the longitudinal directions, of the first and second gate electrodes 15, 16a, 16b in a vertical direction to the longitudinal direction thereof.

Figure 3:
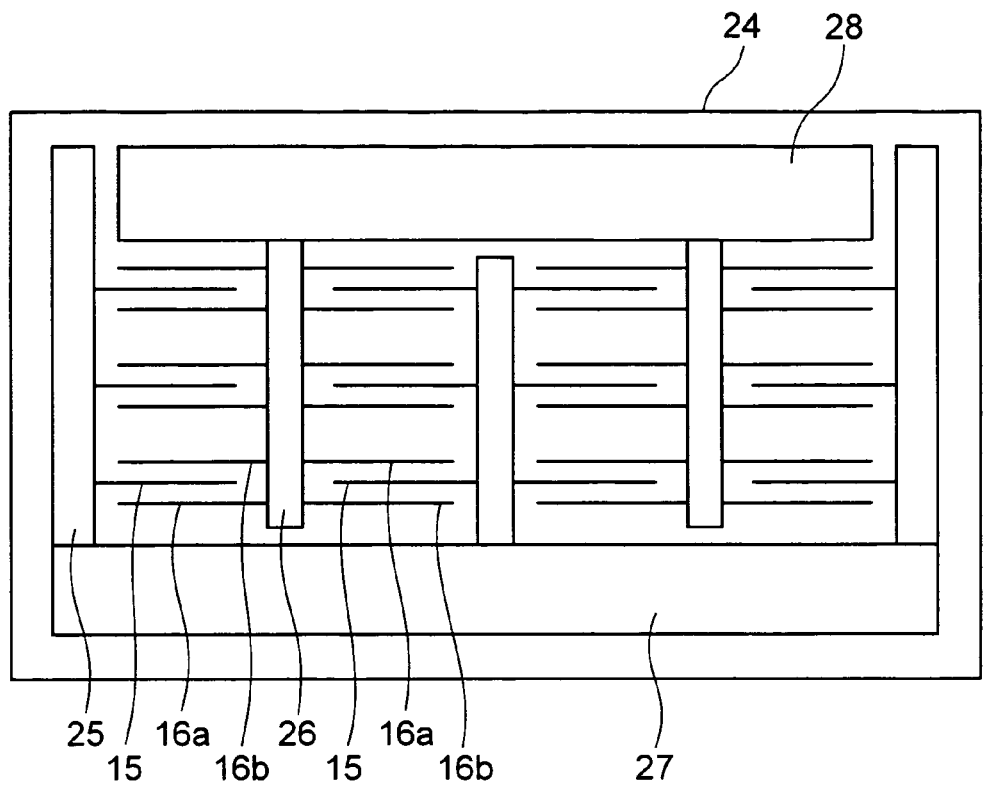
FIG. 3 is a plan view of a semiconductor substrate on which the semiconductor devices shown in FIG. 1 have been formed.

FIG. 3 is a plan view of a semiconductor substrate on which a plurality of IEGT cells shown in FIG. 1 have been formed. A plurality of IEGT cells are formed on a semiconductor substrate 24 in a plane direction in a repetition manner. The first and second gate wires 25, 26 connected with the first and second gate electrodes 15, 16a, 16b are connected to gate electrode taking-out sections 27, 28, respectively.

Figure 4:
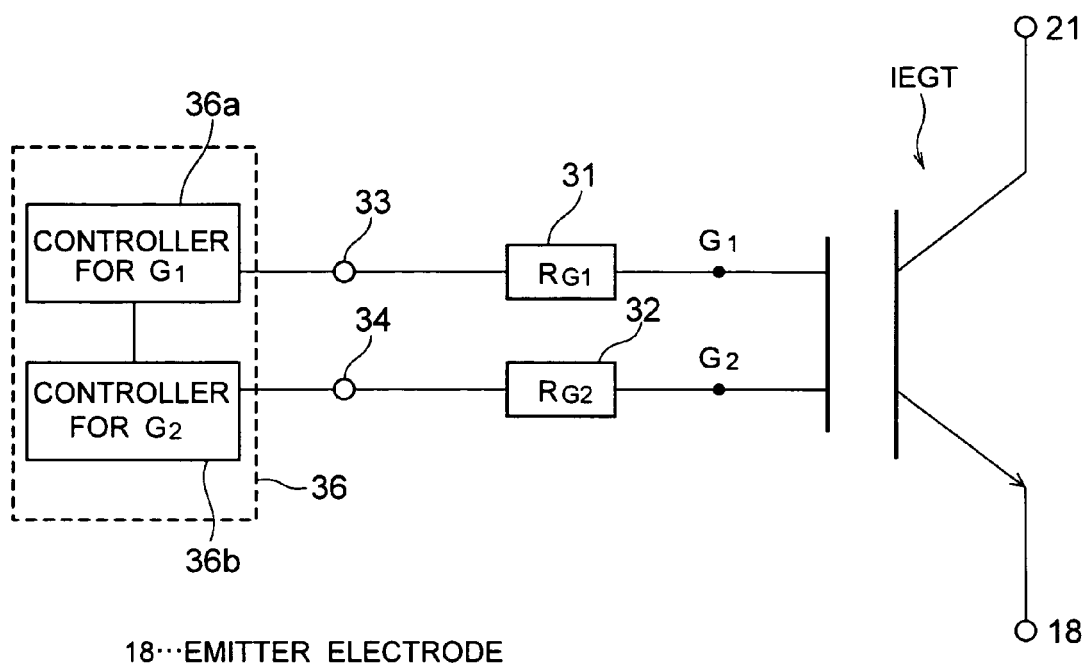
FIG. 4 is a circuit diagram of a semiconductor device including the IEGT shown in FIGS. 1 and 14.

FIG. 4 is a circuit diagram of a semiconductor device including the IEGT shown in FIG. 1. As shown in FIG. 4, the first gate electrode ($G_1$) 15 and the second gate electrodes ($G_2$) 16a and 16b are respectively connected with a first gate resistor ($R_{G1}$) 31 and a second gate resistor ($R_{G2}$) 32. The first gate resistor 31 and the second gate resistor 32 are connected to a first terminal 33 and a second terminal 34. A controller 36 is provided with a control unit 36a for $G_1$ and a control unit 36b for $G_2$, which control gate voltages of the first and second gate electrodes 15, and, 16a, 16b, respectively.

Figure 5:
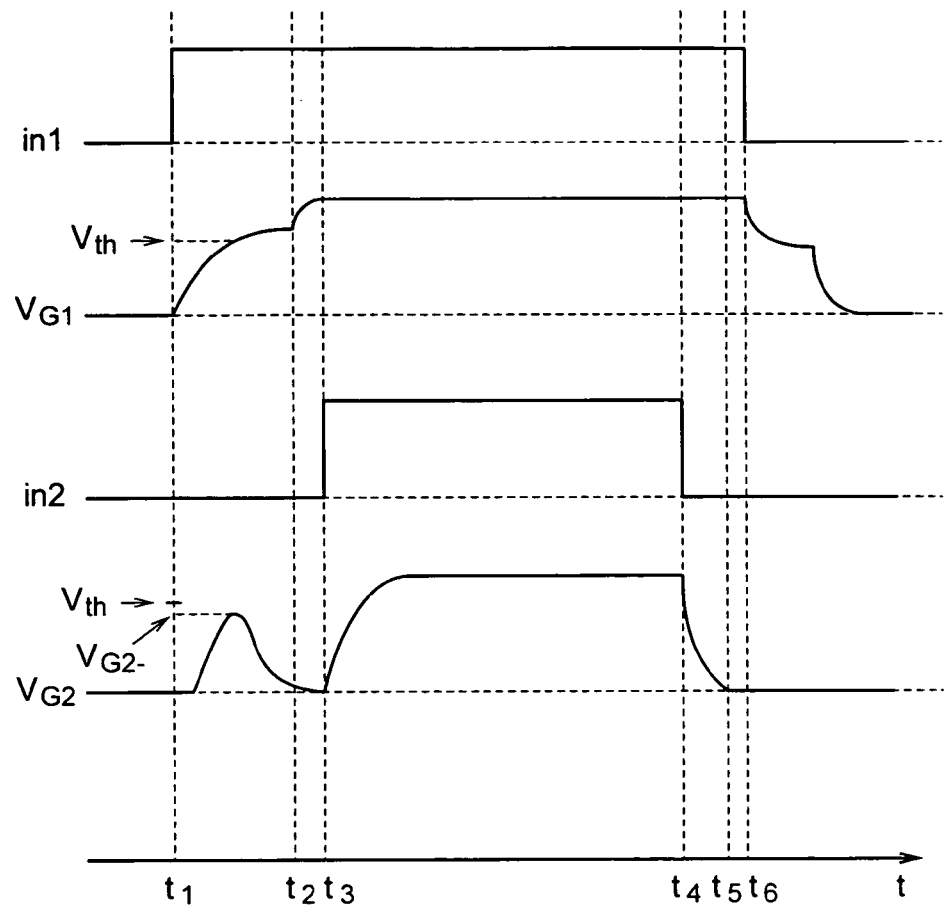
FIG. 5 is a timing chart showing gate voltages and control signals applied to the semiconductor element shown in FIG. 4.

FIG. 5 is a timing chart showing gate voltages $V_{G1}$ and $V_{G2}$ of the first and second gate electrodes 15, and, 16a, 16b in operating the IEGT shown in FIG. 4. When the IEGT shown in FIG. 4 is actuated, a first control signal in1 is applied to the first terminal 33 and a second control signal in2 is applied to the second terminal 34. When the IEGT is turned on, as shown in FIG. 5, a turn-on signal (a rising portion of the first control signal in1) is first inputted into the first terminal 33 before a turn-on signal (a rising portion of the second control signal in2) is inputted into the second terminal 34. When a turn-on signal is inputted into the first terminal 33 at a time of t=t1, the gate voltage $V_{G1}$ rises. When the gate voltage $V_{G1}$ exceeds a threshold voltage Vth, the IEGT in the first gate electrode 15 portion turns on, so that a collector current (not shown) rises and a collector voltage (not shown) starts lowering. Regarding the gate voltage $V_{G1}$ at the first gate electrode 15, a displacement current flows due to a parasitic capacitance between the first gate electrode 15 and the collector until the collector voltage lowers sufficiently. Therefore, the gate voltage $V_{G1}$ is maintained at an approximately constant value by time t=$t_2$ at which the collector voltage lowers sufficiently. The gate voltage $V_{G1}$ rises again after the collector voltage lowers sufficiently.

On the other hand, the second terminal 34 is applied with a turn-on signal at time t=$t_3$ after the gate voltage $V_{G1}$ becomes higher than a fixed value. Since the collector voltage has lowered sufficiently, the gate voltages $V_{G2}$ rise rapidly. The gate voltage $V_{G2}$ has rose up to $V_{G2-}$ before the time t=$t_3$, but this voltage change is caused by negative capacitance of the second gate electrodes 16a, 16b. At this time, a condition of $V_{G2-}<V_{th}$ can be set by connection of the second gate resistor 32 with a small resistance value. Incidentally, the second gate resistor 32 may not be provided additionally.

As shown in FIG. 5, a turn-off signal (a falling portion of the second control signal in2) is inputted into the second gate electrodes 16a and 16b before a turn-off signal (a falling portion of the first control signal in1) is inputted into the first gate electrode 15. When a turn-off signal is inputted into the second gate electrodes 16a and 16b at time t=$t_4$, the gate voltage $V_{G2}$ at the second gate electrode starts lowering. After the gate voltage $V_{G2}$ has lowered at time t=$t_5$, a turn-off signal is inputted into the first gate electrode $G_1$ at time t=$t_6$. When the turn-off signal is inputted into the first gate electrode $G_1$, the gate voltage $V_{G1}$ slightly lowers like the case of inputting of the turn-on signal, and it lowers again after taking an approximately constant value.

Thus, by inputting control signals into the first gate electrode 15 and the second gate electrodes 16a, 16b with easiness of negative capacitance occurrence at different timings to control the electrodes, the first gate electrode 15 can be turned on before turn-on of the second gate electrodes 16a and 16b, while it can be turned off after turn-off of the second gate electrodes 16a, 16b. Accordingly, influence of the negative capacitance is reduced, where the IEGT can be turned on and turned off. Therefore, a turn-on operation and a turn-off operation of the IEGT can be stabilized. Further, influence of the negative capacitance has been reduced by inputting control signals into the first gate electrode 15 and the second gate electrodes 16a and 16b with easiness of negative capacitance occurrence at different timings to control the electrodes, so that an effect for promoting electron injection is not suppressed differently from shallowing trench gates. In addition, since, after an element is turned on by the first gate electrode 15, channels are subsequently formed in the second gate electrodes 16a and 16b portions, a sufficient channel density can be ensured in a current conduction state, so that an ON-state voltage can be reduced.

When an element at the first gate electrode 15 portion is turned on, elements at the second gate electrode 16a and 16b portions have not been turned on yet, so that the density of the gate electrodes is substantially reduced. Therefore, since the gate parasitic capacitance at a turn-on can be reduced, a turn-on time of the IEGT can be shortened and a turn-on loss can be reduced.

When an element at the first gate electrode 15 portion is turned off, elements at the second gate electrode 16a, 16b portions have already been turned off, so that the density of the gate electrodes is substantially reduced. Therefore, since the gate parasitic capacitance at a turn-off can be reduced, a turn-off time of the IEGT can be shortened and turn-off loss can be reduced.

Figure 6:
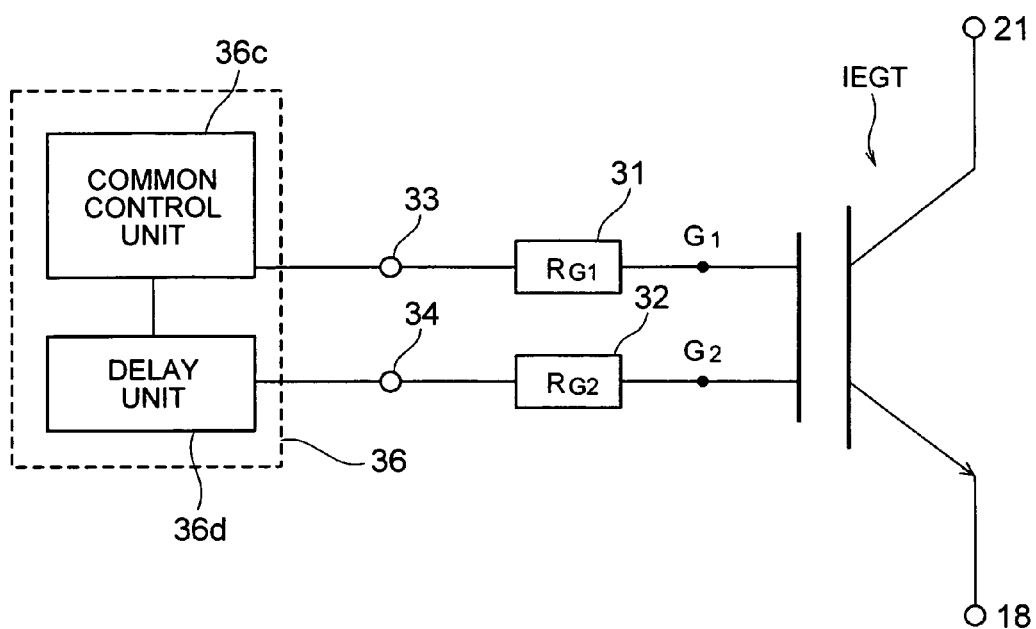
FIG. 6 is a circuit diagram of the semiconductor device including the IEGT illustrated in FIGS. 1 and 14.

In this embodiment, as shown on the circuit diagram of the semiconductor device shown in FIG. 4, the control unit 36a for $G_1$ and the control unit 36b for $G_2$ are provided in the controller 36, but a common control unit 36c and a delay unit 36d may be provided in the controller 36, as shown in FIG. 6. That is, such a constitution can be employed that the first terminal 33 is connected to the common control unit 36c while the second terminal 34 is connected to the common control unit 36c via the delay unit 36d. The delay unit 36d delays a control signal applied to the first gate electrode 15 to transmit the same.

With such a configuration, a turn-on operation similar to that shown in FIG. 5 can be realized and an advantage similar thereto can be obtained by one common control unit. In the turn-off operation, after the first gate electrode 15 is turned off, the turn-off operation of the IEGT is substantially performed by the second gate electrodes 16a and 16b. In this case, the parasitic LCR circuit becomes unstable due to the negative capacitance in the second gate electrodes 16a, 16b, but oscillation can be suppressed by reduction of an inductance component or adjustment of a resistance component such as gate resistances. At a turn-off operation, since the gate electrode density has been substantially reduced by an amount corresponding to the first gate electrode 15, a turn-off time of the IEGT can be shortened and turn-off loss can be reduced.

Figure 7:
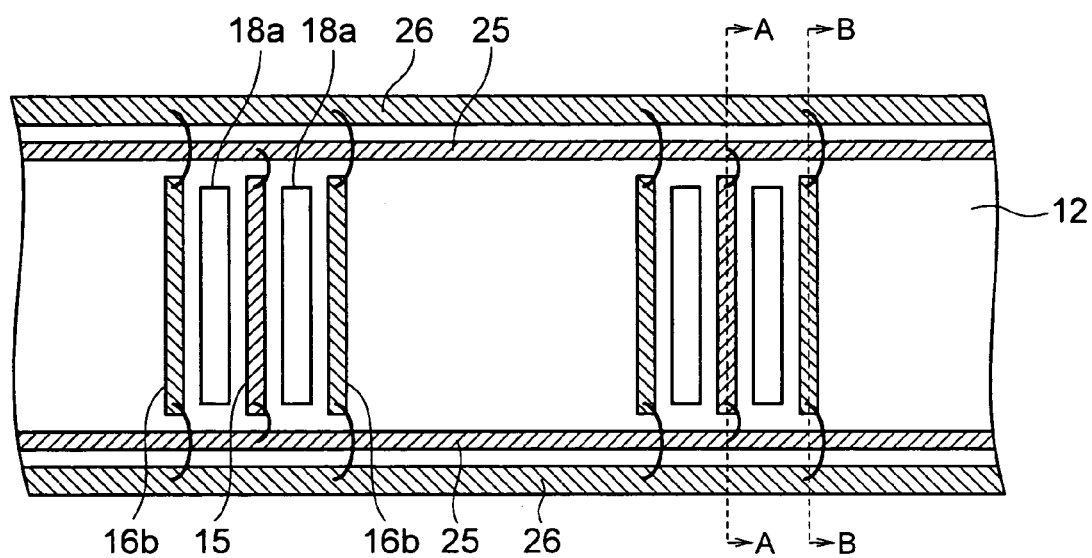
FIG. 7 is a plan view of a modification of a cell portion of the semiconductor device shown in FIG. 1.

FIG. 7 is a plan view of a modification of a cell portion of the semiconductor device shown in FIG. 1. In this modification, first and second gate wires 25, 26 stacked one on another are respectively disposed on one end sides and the other end sides of the first and second gate electrodes 15, 16a, 16b in longitudinal directions in which they extend in vertical direction to the longitudinal directions. The first gate electrode 15 and the second gate electrodes 16a, 16b are respectively connected to the first and second gate wires 25, 26 so as to be inputted with different control signals. Emitter contacts 18a are formed between the first gate electrode 15 and the second gate electrode 16a and between the first gate electrode 15 and the second gate electrode 16b. The first gate wires 25 connected to the first gate electrode 15 and the second gate wires 26 connected to the second gate electrodes 16a, 16b are stacked one on another via insulating films 19, and the respective stacked sets of the first and second gate wires are disposed on an upper side and a lower side of the first and second gate electrodes 15, 16a, 16b on FIG. 7. In FIG. 7, the first gate wire 25 and the second gate wire 26 are illustrated such that they do not overlap each other.

Figure 8A:
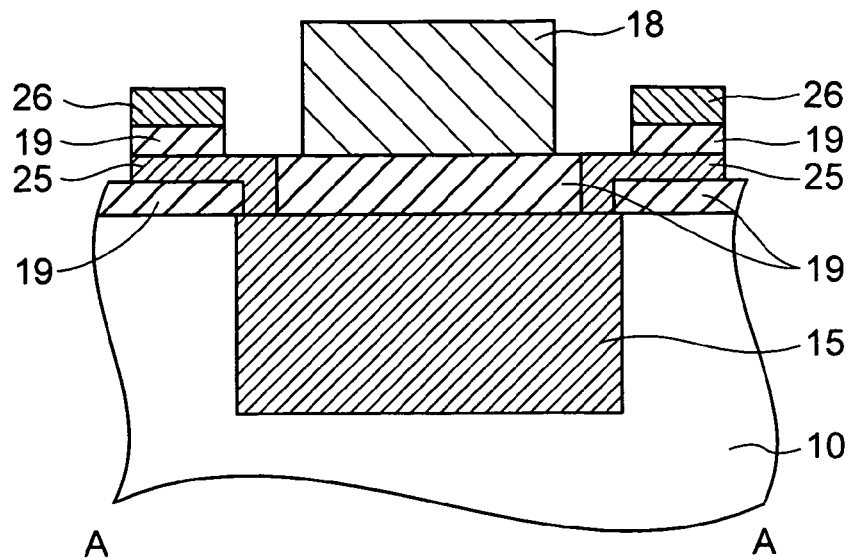
FIG. 8A and FIG. 8B are a sectional view of the semiconductor device shown in FIG. 7.
Figure 8B:
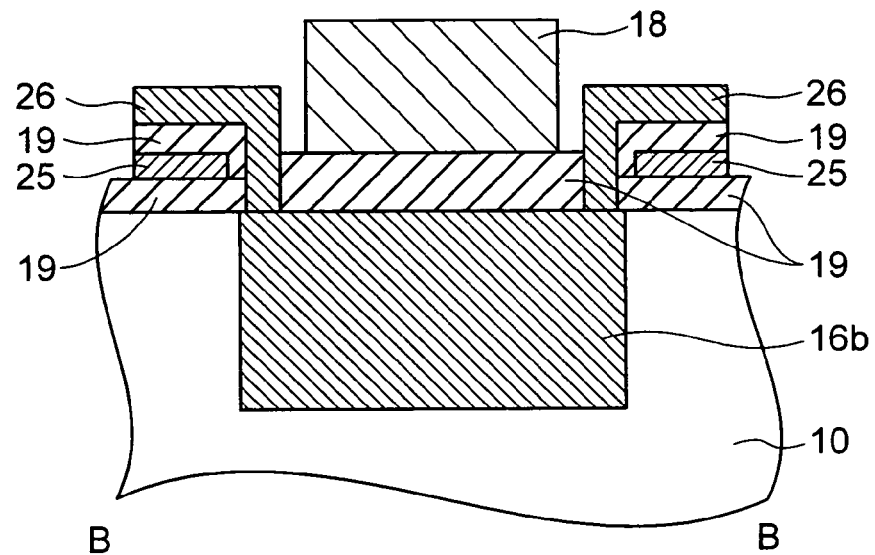

FIG. 8A and FIG. 8B are a sectional view of the semiconductor device shown in FIG. 7, taken along line A—A on FIG. 7 and a sectional view thereof, taken along line B—B on FIG. 7. In FIG. 8A, the first gate wire 25 is formed by drawing an end portion of the first gate electrode 15. In FIG. 8B, the second gate wires 26 are formed by drawing end portions of the second gate electrodes 16a, 16b. The second gate wire 26 is disposed on the first gate wire 25 via the insulating film 19.

With such a constitution, efficient arrangement of respective parts can be achieved. Since both the first and second gate wires 25, 26 can be provided corresponding to both sides of the ends of the gate electrodes, fluctuation of a switching operation due to delay caused by a resistance component in the gate electrodes (polysilicon) can be suppressed.

Such a constitution can be employed that the gate electrodes and the gate wires are connected mutually by extending ends of the gate electrodes or ends of the gate wires or they are connected mutually using connection members.

The first gate wires 25 and the second gate wires 26 are formed on the upper side and the lower side of the first and second gate electrodes 15, 16a, 16b on FIG. 7 and the wires are connected to the electrodes on the both sides, but the electrodes may be connected to the wires on the upper side or the lower side on FIG. 7. Two sets of stacked first gate wire 25 and second gate wire 26 are respectively formed such that each set corresponds to one of the upper side and the lower side of the first and second gate electrodes 15, 16a, 16b on FIG. 7, but they may be formed so as to correspond to only one end side (either one of the upper side and the lower side on FIG. 7) of the first and second gate electrodes 15, 16a, 16b in their longitudinal directions.

Further, the maximum voltage $V_{G2}$ (+) of the gate voltage applied to the second gate electrode can be set to be higher than the maximum voltage $V_{G1}$ (+) of the gate voltage applied to the first gate electrode. With such setting, it becomes possible to obtain a larger promotion effect of electron injection in an electrically conductive state. At this time, since the second gate electrode does not influence a turn-on operation of an element, even if a voltage larger than a voltage applied to the first gate electrode is applied to the second gate electrode, a sudden turn-on operation, increase in short-circuit current or the like is not caused. Therefore, the negative capacitance can be decreased and the ON-state voltage can be reduced.

Further, a voltage $V_{G2(-)}$ of a turn-off signal applied to the second gate electrode can be set to be lower than a voltage $V_{G1(-)}$ of a turn-off signal applied to the first gate electrode. With such setting, when an element is turn off, a p-type inversion layer is formed below the second gate electrode so that holes accumulated can be extracted rapidly. Thereby, a turn-off time can be further shortened and the turn-off loss can be further reduced.

(Second Embodiment)

Figure 9:
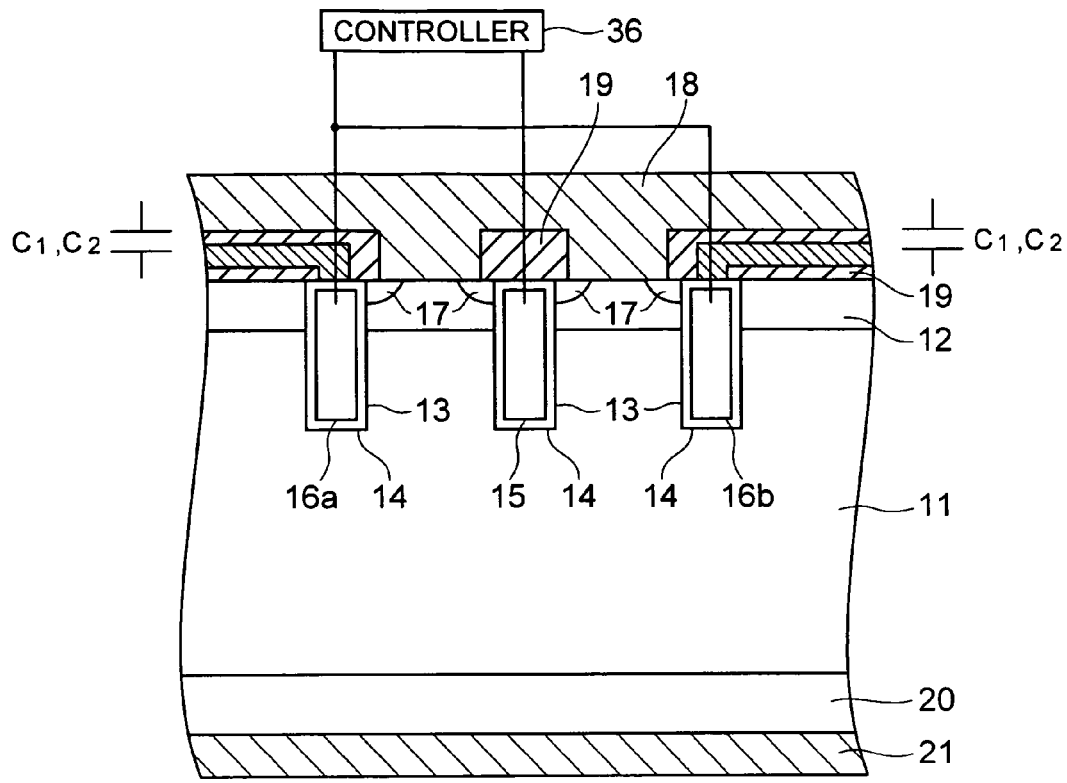
FIG. 9 is a sectional view of a semiconductor device according to a second embodiment of the present invention.

A semiconductor device according to a second embodiment of the present invention will be explained with reference to FIG. 9 to FIG. 11. In this embodiment, same portions or members as those in the first embodiment shown in FIG. 1 to FIG. 8 are denoted by same reference numerals. FIG. 9 is a sectional view of an IEGT having a trench gate structure in this embodiment. In this embodiment, as shown in FIG. 9, a plurality of second gate electrodes ($G_2$) 16a, 16b are drawn out so as to separate from a first gate electrode ($G_1$) 15 formed between the second gate electrodes 16a and 16b. That is, such a configuration that first capacitors $C_1$ are inserted between the second gate electrode 16a and the emitter electrode 18 and between the second gate electrode 16b and the emitter electrode 18 is obtained. The first and second gate electrodes 15, and, 16a, 16b are electrically connected with first and second terminals (not shown), respectively, and the first and second terminals are electrically connected to a controller 36 which controls first and second gate voltages. The plan view of the IEGT is the same as the plan view for the above-described first embodiment.

When the IEGT is turned on in a state that a high voltage has been applied to the collector electrode, holes injected from the p-type emitter layer are accumulated in an interface of the n-type base layer at a portion where the contacts for the emitter electrode have been thinned. A negative capacitance is produced due to negative charges on the gate electrode induced by a channel of the holes. Insulating films 19 are formed on the first and second gate electrodes 15, 16a, and 16b, and contacts for the emitter electrodes are formed on both sides of the insulating film 19 on the first gate electrode 15, namely, on only one sides of the insulating films 19 on the second gate electrodes 16a and 16b. Therefore, the second gate electrodes 16a and 16b easily produce negative capacitance, because holes are accumulated on side walls on the other sides of the second gate electrodes 16a, 16b so that channels of holes are formed.

Figure 10:
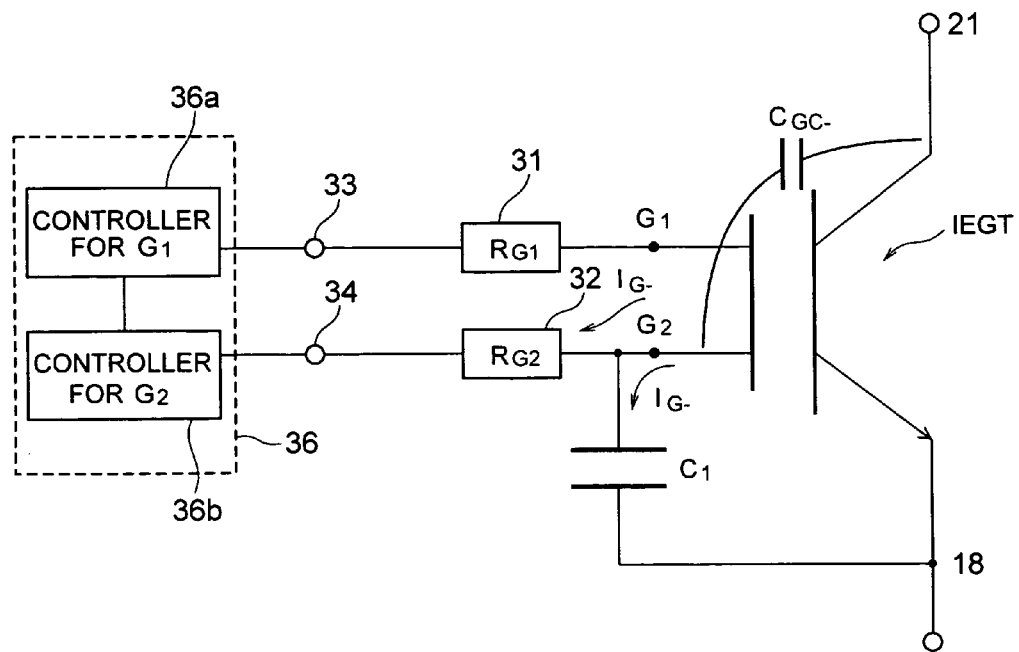
FIG. 10 is a circuit diagram of a semiconductor device including the IEGT shown in FIG. 9.

FIG. 10 is a circuit diagram of a semiconductor device including the IEGT shown in FIG. 9. A first capacitor $C_1$ is inserted between a gate and an emitter of an IEGT at the second gate electrode ($G_2$) 16a, 16b portion. The first gate electrode ($G_1$) 15 and the plurality of the second gate electrodes 16a, 16b are respectively connected with a first gate resistor ($R_{G1}$) 31 and a second gate resistor ($R_{G2}$) 32. The first gate resistor 31 and the second gate resistor 32 are connected to a first terminal 33 and a second terminal 34. A controller 36 is provided with a control unit 36a for $G_1$ and a control unit 36b for $G_2$, which controls gate voltages of the first and second gate electrodes 15, 16a, 16b, respectively.

As shown in FIG. 10, by inserting the first capacitor $C_1$, impedance between the gate and the emitter can be reduced. Since a current $I_{G-}$ due to a negative capacitance $C_{GC-}$ is branched to the second gate resistor 32 and the first capacitor $C_1$, a voltage drop due to the second gate resistor 32 can be reduced.

Figure 11:
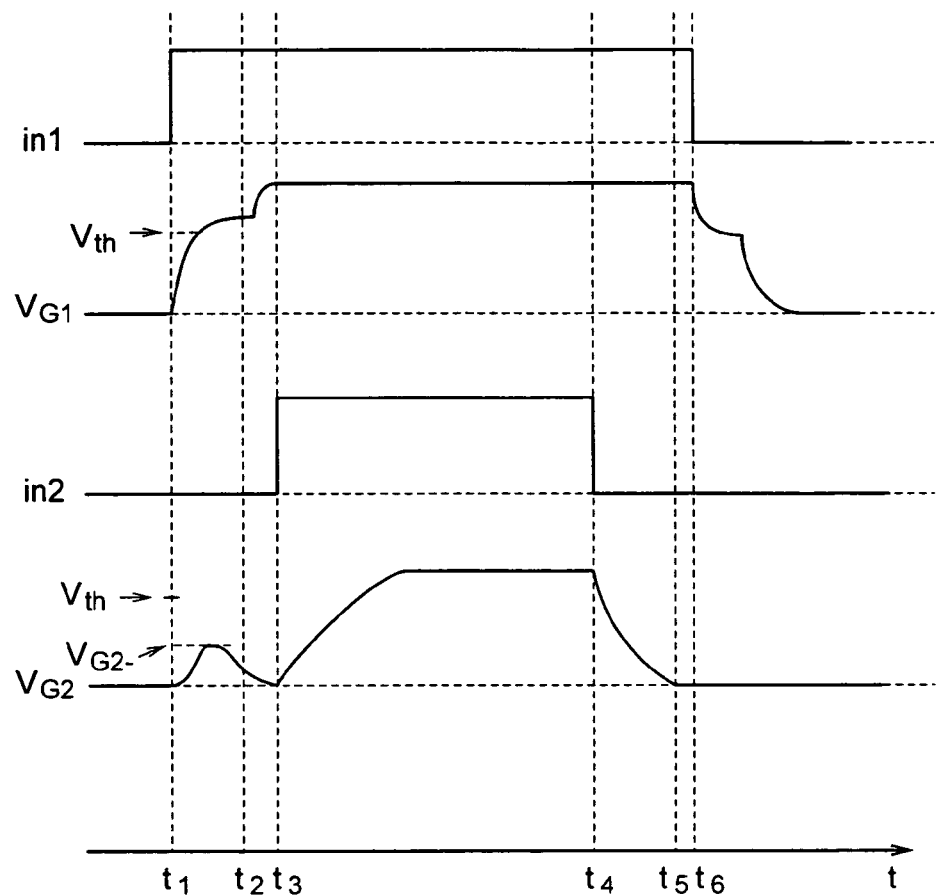
FIG. 11 is a timing chart showing gate voltages and control signals applied to the semiconductor element shown in FIG. 9.

FIG. 11 is a timing chart showing fluctuations of gate voltages $V_{G1}$ and $V_{G2}$ of the first and second gate electrodes 15, 16a, 16b according to time elapsing when control is performed by actuating the IEGT shown in FIG. 10. When the IEGT shown in FIG. 10 is actuated, a first control signal in1 is applied to the first terminal 33 and a second control signal in2 is applied to the second terminal 34. When the IEGT is turned on, as shown in FIG. 11, a turn-on signal (a rising portion of the first control signal in1) is first inputted into the first terminal 33 before a turn-on signal (a rising portion of the second control signal in2) is inputted into the second terminal 34. When the turn-on signal is inputted into the first terminal 33 at a time of t=t$_1$, the gate voltage $V_{G1}$ rises. When the gate voltage $V_{G1}$ exceeds a threshold voltage $V_{th}$, the IEGT in the first gate electrode 15 portion turns on, so that a collector current (not shown) rises and a collector voltage (not shown) starts lowering. Regarding the gate voltage $V_{G1,}$ a displacement current flows due to a parasitic capacitance between the first gate electrode 15 and the collector until the collector voltage lowers sufficiently. Therefore, the gate voltage $V_{G1}$ is maintained at an approximately constant value by time t=$t_2$ at which the collector voltage lowers sufficiently. The gate voltage $V_{G1}$ rises again after the collector voltage lowers sufficiently.

On the other hand, a turn-on signal is inputted into the second terminal 34 at time t=$t_3$ after the gate voltage $V_{G1}$ becomes higher than a fixed value. Since the collector voltage has lowered sufficiently, the gate voltages $V_{G2}$ at the second gate electrodes 16a and 16b rise rapidly. Here, a rising speed or rate of the gate voltage $V_{G2}$, after a turn-on signal is inputted into the second gate electrodes 16a, 16b, is delayed due to insertion of the first capacitor $C_1$, so that turn-on of an element at the second gate electrodes 16a, 16b portion is delayed. The gate voltage $V_{G2}$ has rose up to $V_{G2-}$ before the time t=$t_3$, but this voltage change is caused by negative capacitance of the second gate electrode 16a, 16b portions. The magnitude of the voltage $V_{G2-}$ due to the negative capacitance lowers. At this time, a condition of $V_{G2-} < V_{th}$ can be set by connection of the second gate resistor 32 with a small resistance value. Since the magnitude of the voltage $V_{G2-}$ due to the negative capacitance lowers, the degree of freedom for selection of resistance vales of the second gate resistor 32 can be expanded. Incidentally, the second gate resistor 32 may not be provided additionally.

Further, as shown in FIG. 11, when the IEGT shown in FIG. 10 is turned off, a turn-off signal (a falling portion of the second control signal in2) is inputted into the second gate electrodes 16a, 16b before a turn off signal (a falling portion of the first control signal in1) is inputted into the first gate electrode 15. At this time, the dropping rate of the gate voltage $V_{G2}$ becomes slow, so that turn-off of an element at the second gate electrode 16a, 16b portion is delayed. However, such setting is made that the element at the second gate electrodes 16a, 16b is turned off before turning-off of the element at the first gate electrode 15 portion. When a turn-off signal is inputted into the second gate electrodes 16a, 16b at time t=$t_4$, the gate voltage $V_{G2}$ starts dropping. After the gate voltage $V_{G2}$ has dropped at time t=$t_5$, a turn-off signal is inputted into the first gate electrode 15 at time t=$t_6$. When the turn-off signal is inputted into the first gate electrode 15, the gate voltage $V_{G1}$ slightly drops like the case that the turn-on signal is inputted into the first gate electrode 15, and after the gate voltage $V_{G1}$ is maintained at approximately constant value, it drops again.

In this embodiment, the capacitor is inserted by forming the same on the semiconductor substrate on which the IEGT has been formed, but it may be inserted separately of the semiconductor substrate on which the IEGT has been formed.

Thus, by inputting different control signals from each other into the first gate electrode 15, and the second gate electrodes 16a and 16b with easiness of negative capacitance occurrence to control the electrodes, the first gate electrode 15 can be turned on before turning-on of the second gate electrodes 16a, 16b, while it can be turned off after turning-off of the second gate electrodes 16a, 16b. Accordingly, influence of the negative capacitance is reduced, where the IEGT can be turned on and turned off. Therefore, a turn-on operation and a turn-off operation of the IEGT can be stabilized. Further, influence of the negative capacitance has been reduced by inputting control signals into the first gate electrode 15 and the second gate electrodes 16a, 16b with easiness of negative capacitance occurrence at different timings to control the electrodes, so that an effect for promoting electron injection is not suppressed differently from shallowing trench gates. In addition, since, after an element is turned on by the first gate electrode 15, channels are subsequently formed in the second gate electrode 16a, 16b portions, a sufficient channel density can be ensured in a current conduction state, so that an ON-state voltage can be reduced.

When an element at the first gate electrode 15 portion is turned on, elements at the second gate electrode 16a and 16b portions have been not turned on yet, so that the density of the gate electrodes is substantially reduced. Therefore, since the gate parasitic capacitance at a turn-on can be reduced, a turn-on time of the IEGT can be shortened and turn-on loss can be reduced.

When an element at the first gate electrode 15 portion is turned off elements at the second gate electrode 16a and 16b portions have already been turned off, so that the density of the gate electrodes is substantially reduced. Therefore, since the gate parasitic capacitance at a turn-off can be reduced, a turn-off time of the IEGT can be shortened and turn-of loss can be reduced.

Further, since the magnitude of the voltage rising due to the negative capacitance can be reduced, a turn-on operation and a turn-off operation of the IEGT can be made more stable. An interval from inputting a turn-on signal into the first gate electrode 15 to inputting a turn-on signal into the second gate electrodes 16a and 16b can be shortened and the IEGT can be turned on more rapidly.

(Modification)

A semiconductor device and a method of controlling the same according to a modification of the second embodiment of the present invention will be explained with reference to FIG. 12 and FIG. 13. Same portions or parts as those in the first embodiment shown in FIG. 1 to FIG. 8 are denoted by same reference numerals. A sectional view of an IEGT having a trench gate structure in this modification is the same as that shown in FIG. 9.

Figure 12:
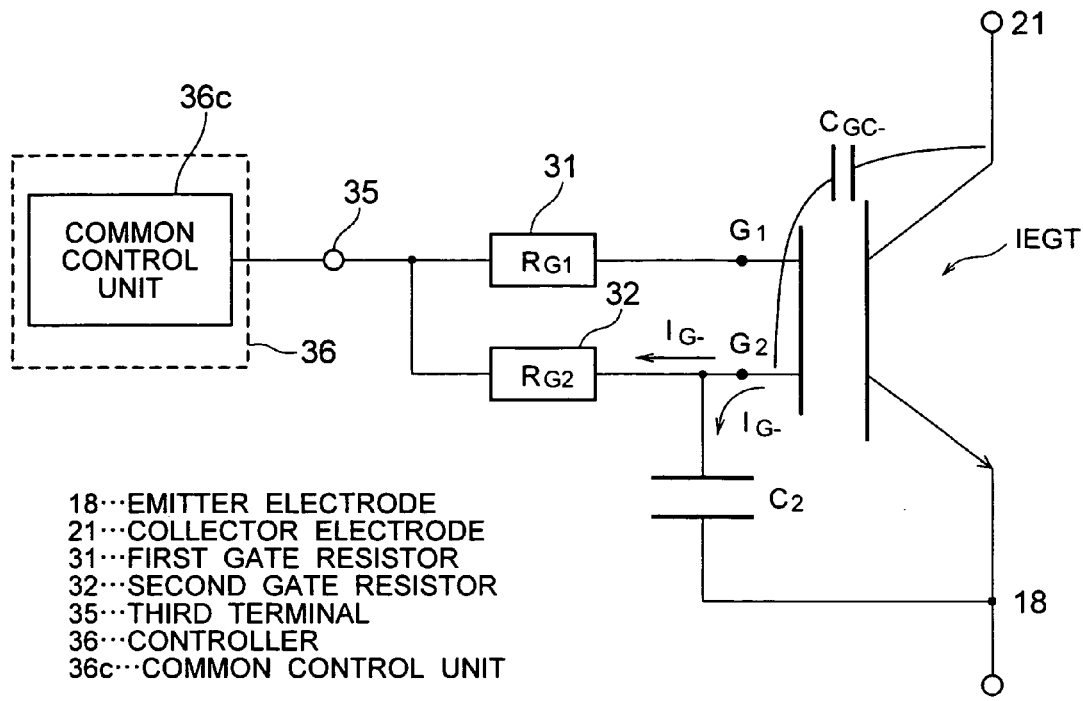
FIG. 12 is a circuit diagram of a semiconductor device including the semiconductor element shown in FIG. 9.

FIG. 12 is a circuit diagram of the semiconductor device including the IEGT shown in FIG. 9. As shown in FIG. 12, a second capacitor $C_2$ is inserted between the gate and the emitter of the IEGT at the second gate electrode 16a, 16b portion. A first gate resistor ($R_{G1}$) 31 and a second gate resistor ($R_{G2}$) 32 are respectively connected between the first gate electrode 15 and the second gate electrode 16a and between the firs gate electrode 15 and the second gate electrode 16b. The first gate resistor 31 and the second gate resistor 32 are connected to a third terminal 35. In this modification, the first gate electrode $G_1$ and the second gate electrode $G_2$ are connected to the same or one terminal via the first and second gate resistors 31, 32. The third terminal 35 is connected to a controller 36 which controls gate voltages of the first and second gate electrodes 15, 16a, 16b. The controller 36 is provided with a common control unit 36c for $G_1$, $G_2$, which controls gate voltages of the first and second gate electrodes 15, 16a, 16b.

As shown in FIG. 12, impedance between the gate and the emitter can be reduced by insertion of the second capacitor $C_2$. Since a current $I_{G-}$ due to a negative capacitance $C_{GC-}$ is branched to the second gate resistor 32 and the second capacitor $C_2$, a voltage drop due to the second gate resistor 32 can be reduced.

Figure 13:
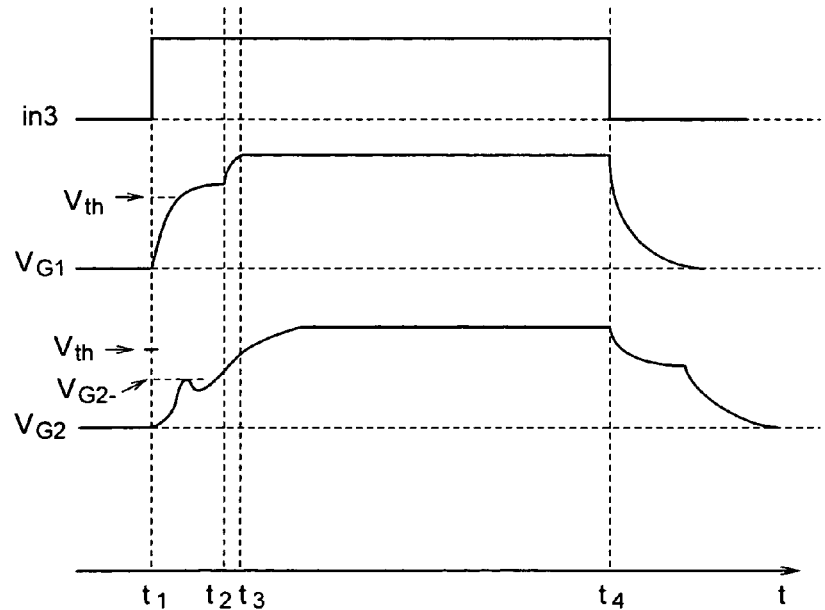
FIG. 13 is a timing chart showing gate voltages and control signals applied to the semiconductor element shown in FIG. 9.

FIG. 13 is a timing chart showing changes of gate voltages $V_{G1}$ and $V_{G2}$ at the first and second gate electrodes 15, 16a, 16b in operating the IEGT shown in FIG. 12. When the IEGT shown in FIG. 12 is actuated, a third control signal in3 is applied to the third terminal 35. As shown in FIG. 13, when the IEGT is turned on, a turn-on signal (a rising portion of the third control signal in3) is inputted into the third terminal 35. The gate voltages $V_{G1}$, $V_{G2}$ start rising at time t=t1. The rising rate of the gate voltage $V_{G2}$ is made slow due to insertion of the second capacitor $C_2$. When the gate voltage $V_{G1}$ exceeds the threshold voltage $V_{th}$, the IEGT at the first gate electrode 15 portion turns on, a collector current (not shown) rises, and a collector voltage (not shown) starts lowering. Regarding the gate voltage $V_{G1}$, a displacement current flows due to a parasitic capacitance between the first gate electrode 15 and the collector until the collector voltage lowers sufficiently. Therefore, the gate voltage $V_{G1}$ is maintained at an approximately constant value by time t=$t_2$ at which the collector voltage lowers sufficiently. The gate voltage $V_{G1}$ rises again after the collector voltage lowers sufficiently.

The gate voltage $V_{G2}$ rises with a delay from the gate voltage $V_{G1}$. The gate voltage $V_{G2}$ has rose up to the $V_{G2-}$ before time t=$t_3$, but this voltage fluctuation is caused by the negative capacitance of the second gate electrode 16a, 16b portion. The magnitude of the voltage $V_{G2-}$ due to the negative capacitance lowers. At this time, a condition of $V_{G2-}<V_{th}$ can be set by connection of the second gate resistor 32 with a small resistance value. Since, after the gate voltage $V_{G1}$ becomes higher than the constant value, the collector voltage has lowered sufficiently, the gate voltage $V_{G2}$ rises rapidly.

As shown in FIG. 13, when the IEGT shown in FIG. 12 is turned off, a turn-off signal (a falling portion of the third control signal in3) is inputted into the third terminal at time t=$t_4$, so that the gate voltages $V_{G1}$ and $V_{G2}$ drop. The dropping rate of the gate voltage $V_{G2}$ at the second gate electrode 16a, 16b becomes slow due to insertion of the second capacitor $C_2$. The gate voltage $V_{G1}$ lowers to turn off the first gate electrode 15, and, after the gate voltage $V_{G2}$ at the second gate electrode $G_2$ slightly lowers to be maintained at an approximately constant value, it lowers again to turn off the second gate electrode 16a, 16b with a delay from the turn-off of the first gate electrode 15.

In the modification, the second capacitor $C_2$ is inserted by forming the same on the semiconductor substrate with the IEGT formed, but it may be inserted separately of the semiconductor substrate with the IEGT formed.

Thus, control is made by lowering a rising (or lowering) rate of the gate voltage $V_{G2}$ by the second capacitor $C_2$ inserted between the gate and the emitter of the IEGT at the second gate electrode 16a, 16b portion and inputting different signals to the first and second gate electrodes 15, 16a, 16b, respectively. That is, by controlling the first gate electrode and the second gate electrodes with easiness of negative capacitance occurrence with different signals (a main signal and a delay signal obtained by the main signal), the first gate electrode 15 is turned on before turning-on of the second gate electrode 16a, 16b. Accordingly, influence of the negative capacitance is reduced, where the IEGT can be turned on and turned off. Thereby, a turn-on operation and a turn-off operation of the IEGT can be made stable. Further, influence of the negative capacitance has been reduced by controlling the first gate electrode 15 and the second gate electrodes 16a and 16b with easiness of negative capacitance occurrence utilizing different timing signals, so that an effect for promoting electron injection is not suppressed differently from shallowing trench gates. In addition, since, after an element is turned on by the first gate electrode 15, the rising rate of the gate voltage $V_{G2}$ is made slow and a channel is also formed in the second gate electrode 16a, 16b portion, a sufficient channel density can be ensured in a current conduction state, so that an ON-state voltage can be reduced.

When an element at the first gate electrode 15 portion is turned on, an element at the second gate electrode 16a, 16b portion has not been turned on yet, so that density of the gate electrodes has been substantially reduced. Therefore, since a gate parasitic capacitance at a turn-on can be reduced, the turn-on time of the IEGT can be shortened and turn-on loss can be reduced.

When an element at the second gate electrode 16a, 16b portion is turned off, the element at the first gate electrode 15 portion have already been turned off, so that the density of the gate electrodes is substantially reduced. Therefore, since the gate parasitic capacitance at a turn-off can be reduced, a turn-off time of the IEGT can be shortened and turn-off loss can be reduced.

Further, since the magnitude of the voltage rising due to the negative capacitance can be reduced, a turn-on operation and a turn-off operation of the IEGT can be made more stable. An interval from inputting a turn-on signal into the first gate electrode 15 to inputting a turn-on signal into the second gate electrode 16a, 16b can be shortened and the IEGT can be turned on more rapidly.

Figure 14:
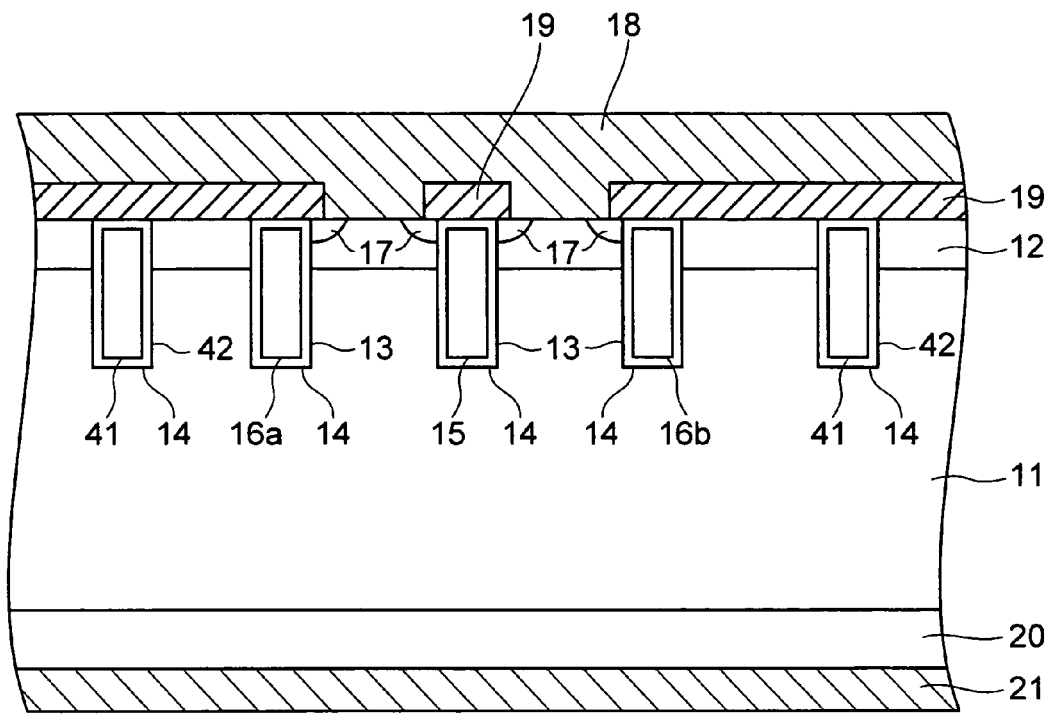
FIG. 14 is a sectional view of a semiconductor device according to a first and second embodiment of the present invention.
Figure 15:
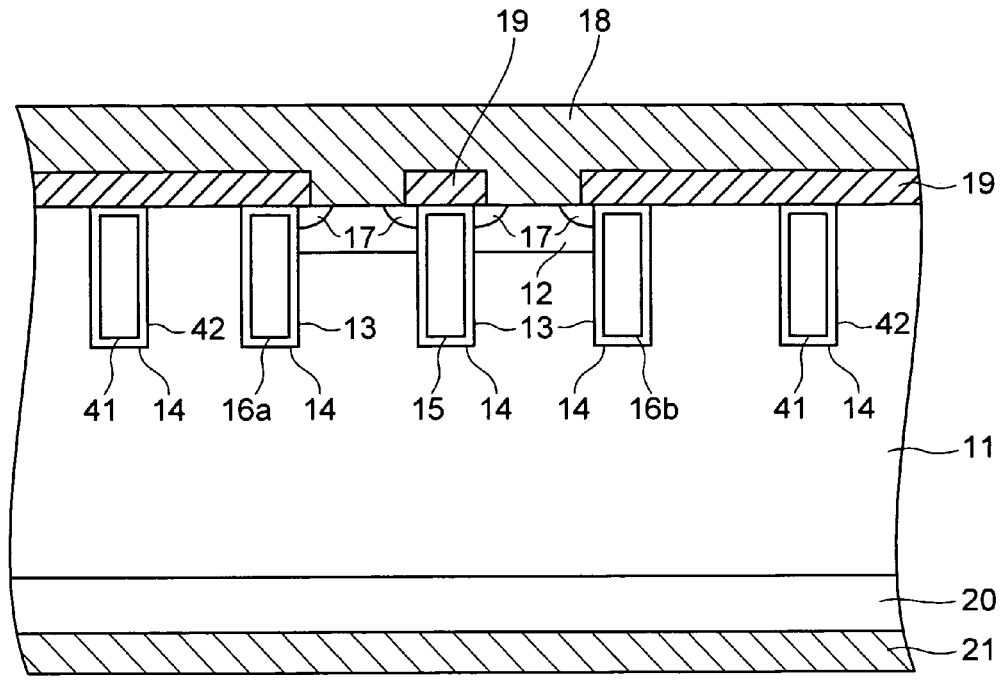
FIG. 15 is a sectional view of a semiconductor device according to a first and second embodiment of the present invention.

As described above, in the first and second embodiments, the structure where a plurality of unit cells are arranged and connected in parallel has been explained as examples. As shown in FIG. 14, however, such a structure that one or a plurality of trenches 42, in which an emitter electrode 41 has been embedded, has been formed between unit cells may be applied to this invention. As shown in FIG. 15, such a structure that the p-type base layer 12 is not formed between adjacent unit cells may be applied with the present invention.

(Third Embodiment)

Figure 16:
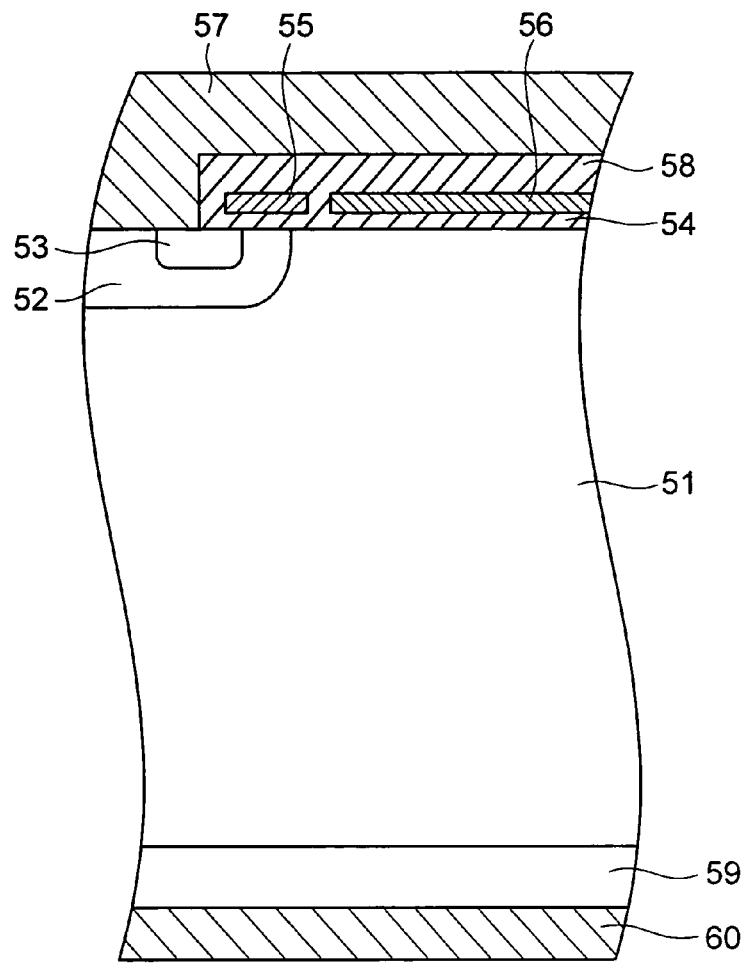
FIG. 16 is a sectional view of a semiconductor device according to a third embodiment of the present invention.

A semiconductor device according to a third embodiment of the present invention will be explained with reference to FIG. 16 to FIG. 23. FIG. 16 is a sectional view of an IEGT with a planar gate structure in this embodiment. As shown in FIG. 16, a p-type base layer 52 is formed on a surface area of a first surface of an n-type base layer 51 formed of a semiconductor substrate. An n-type source layer 53 is formed on a surface region of the p-type base layer 52. A first gate electrode ($G_1$) 55 is formed on the p-type base layer 52 via a gate insulating film 54. A second gate electrode ($G_2$) 56 is formed on the n-type base layer 53 via the gate insulating film 54 so as to separate from the first gate electrode 55. A common emitter electrode 57 is formed on the p-type base layer 52 and the n-type source layer 53. The emitter electrode 57 is also formed on the second gate electrode ($G_2$) 56 via an insulating film 58. On the other hand, a p-type emitter layer 59 is formed on a second face of the n-type base layer 53. A collector electrode 60 is formed on the p-type emitter layer 59. FIG. 16 shows ½ of the unit cell structure of the IEGT. However, in an actual structure of the IEGT, a plurality of the unit cells are connected in parallel.

When the IEGT is turned on in a state of application of a high voltage on the collector electrode, holes injected from the p-type emitter layer are accumulated in an upper side of the n-type base layer. A negative capacitance occurs due to induction of negative charges in the gate electrode caused by the hole channel. Since an area of a portion of the first gate electrode 55 opposed to the n-type base layer is small, a negative capacitance is hard to occur in the first gate electrode 55. On the other hand, since holes accumulated below the second gate electrode 56 so that the hole channel is formed, a negative capacitance is easy to occur in the second gate electrode 56.

Figure 17:
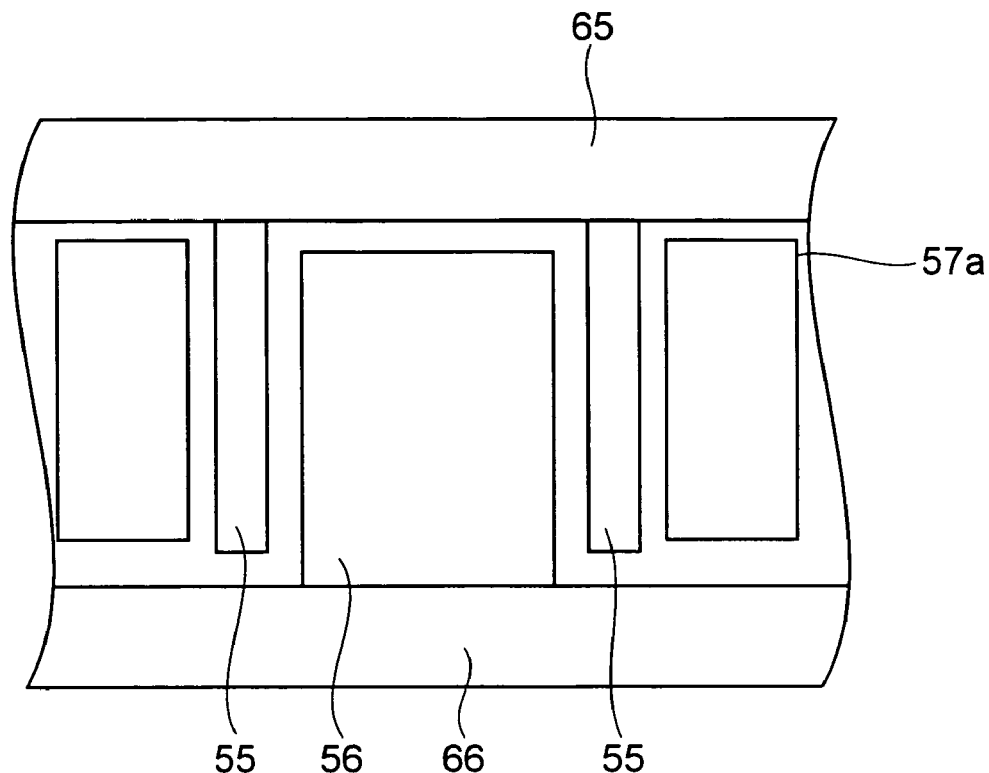
FIG. 17 is a plan view of a cell portion of the semiconductor device shown in FIG. 16.

FIG. 17 is a plan view of a cell portion of the semiconductor device shown in FIG. 16. The first gate electrode 55 and the second gate electrode 56 are connected to different first and second gate wires 65, 66 so as to be inputted with different control signals, respectively. Contacts 57a for the emitter electrode are also formed. The first gate wire 65 connected with the first gate electrode 55 is arrange on an upper side of the first and second gate electrodes 55, 56 on FIG. 17. The second gate wire 66 connected with the second gate electrode 56 is arranged on a lower side of the first and second gate electrodes 55, 56 on FIG. 17. Each gate electrode and each gate wire may be connected to each other by extending an end of the gate electrode or an end of the gate wire, or they may be connected to each other using connection members.

Figure 18:
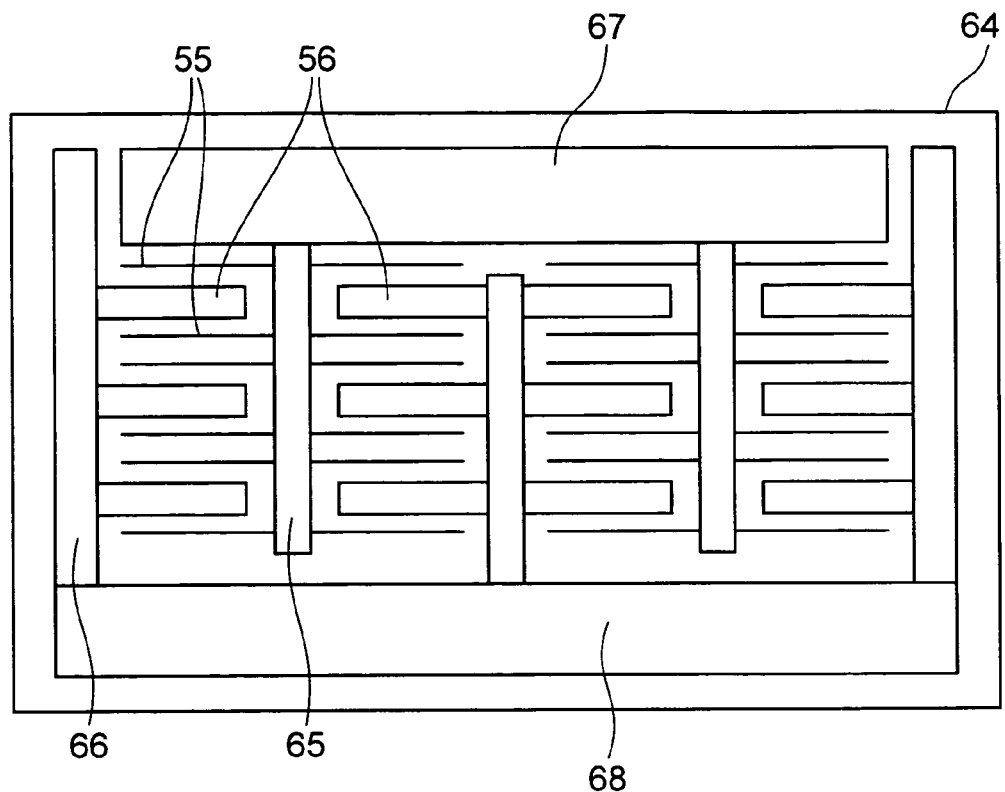
FIG. 18 is a plan view of a semiconductor substrate on which the semiconductor devices shown in FIG. 16 have been formed.

FIG. 18 is a plan view of a semiconductor substrate on which a plurality of the IEGT cells shown in FIG. 16 have been formed. A plurality of IEGT cells are formed on a semiconductor substrate 64 in a plane direction in a repeating manner. The first and second gate wires 65, 66 connected with the first and second gate electrodes 55, 56 are connected to gate electrode taking-out sections 67, 68, respectively.

Figure 19:
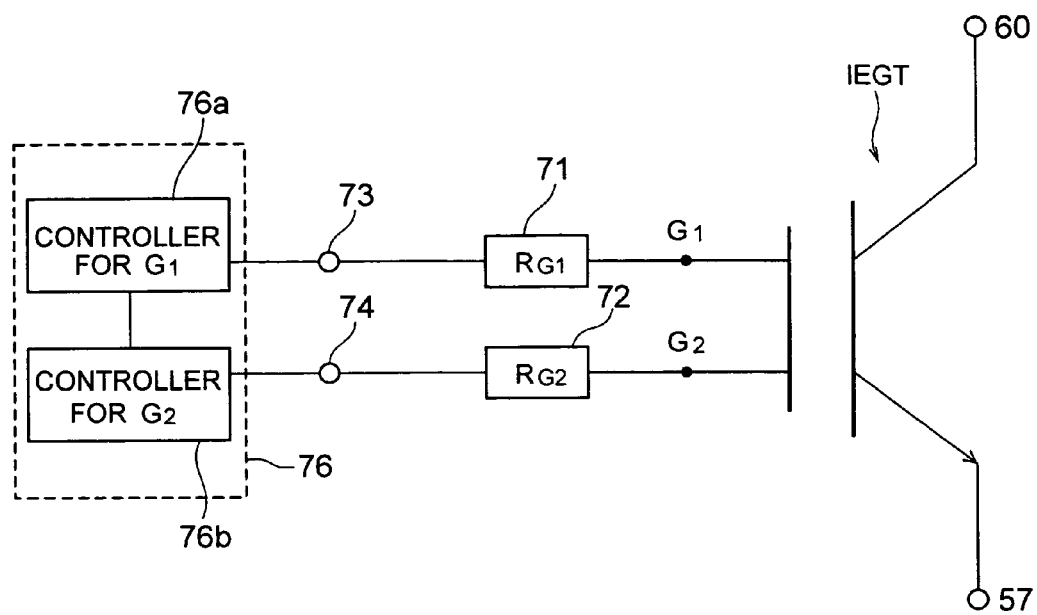
FIG. 19 is a circuit diagram of the semiconductor device including the IEGT shown in FIG. 16.

FIG. 19 is a circuit diagram of the semiconductor device including the IEGT shown in FIG. 16. As shown in FIG. 19, a first gate resistor ($R_{G1}$) 71 and a second gate resistor ($R_{G2}$) 72 are respectively connected to the first gate electrode 55 and the second gate electrode 56. The first gate resistor 71 and the second gate resistor 72 are connected to a first terminal 73 and a second terminal 74. The first and second terminals 73, 74 are connected to a controller 76 which controls gate voltages of the first and second gate electrodes 71, 72. The controller 76 is provided with a control unit 76a for $G_1$ and a control unit 76b for $G_2$, which control gate voltages of the first and second gate electrodes 55, 56, respectively.

In this embodiment, since the second gate electrode 56 portion is not formed with an n-type channel, it does not contribute to a switching operation, and the IEGT operates owing to a channel in the first gate electrode 55 portion. For this reason, for example, even if a negative capacitance occurs in the second gate electrode 56 and the gate voltage $V_{G2}$ at the second gate electrode 56 rises, such rising will not influence a turn-on operation of the IEGT so much.

In the embodiment, first and second control signals in1, in2 are applied to the first and second gate electrodes 55, 56 at timings similar to the timings shown in FIG. 5. By separating the first gate electrode 55 and the second gate electrode 56 with easiness of negative capacitance occurrence from each other, influence of a negative capacitance can be reduced, where the IEGT can be turned on and turned off. Therefore, a turn-on operation and a turn-off operation of the IEGT can be stabilized. By separating the first gate electrode 55 and the second gate electrode 56 with easiness of negative capacitance occurrence from each other, the influence of a negative capacitance has been reduced and an effect for promoting electron injection is not suppressed differently from a formation of a thick gate insulating film on the n-type base layer. Further, after an element is turned on by the first gate electrode 55, such a voltage as a positive voltage relative to the emitter voltage is applied to the second gate electrode 56, so that an n-type accumulation layer can be formed in an electrically conductive state and an ON-state voltage can be reduced.

When the first gate electrode 55 is turned on, the density of the gate electrodes has been reduced substantially, so that a gate parasitic capacitance at a turn-on can be reduced. Thereby, the turn-on time of the IEGT can be shortened and turn-on loss can be reduced. When the first gate electrode 55 is turned off, the density of the gate electrodes has been reduced substantially, so that a gate parasitic capacitance at a turn-off can be reduced. Thereby, the turn-off time of the IEGT can be shortened and the turn-off loss can be reduced.

Figure 20:
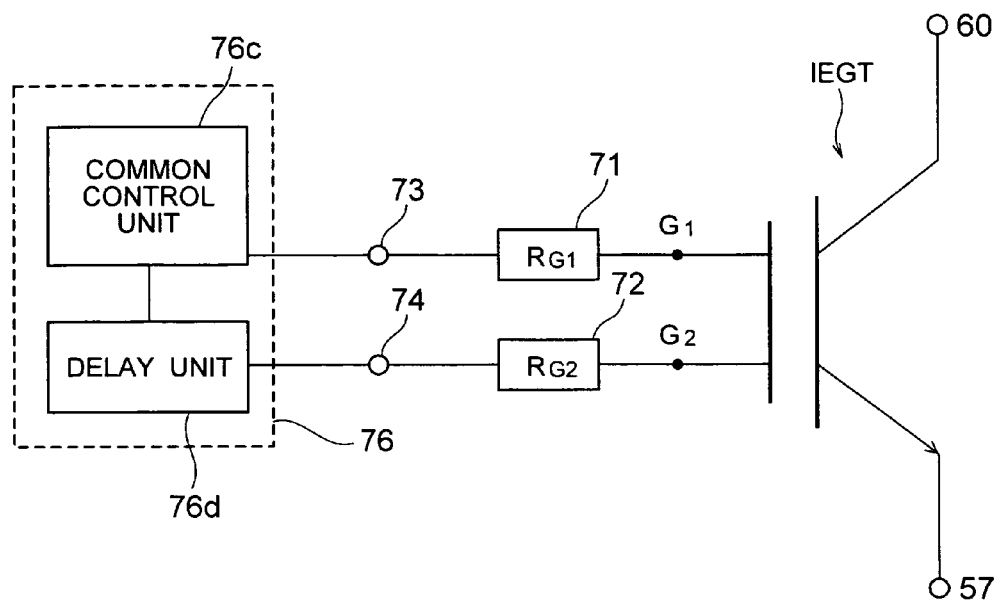
FIG. 20 is a circuit diagram of the semiconductor device including the IEGT shown in FIG. 16.

In this embodiment, as shown on the circuit diagram of the semiconductor device shown in FIG. 19, the control unit 76a for $G_1$ and the control unit 76b for $G_2$ are provided in the controller 76, but a common control unit 76c and a delay unit 76d may be provided in the controller 76, as shown in FIG. 20. That is, such a constitution may be employed that the first terminal 73 is connected to the common control unit 76c, while the second terminal 74 is connected to the common control unit 76c via the delay unit 76d. The delay unit 76d delays a control signal applied to the first gate electrode $G_1$ to transmit the same.

With such a constitution, a turn-on operation similar to that shown in FIG. 5 can be realized and a similar advantage can be obtained by one common control unit. As a result, the turn-off operation of the IEGT is substantially performed by turning-off of the first gate electrode 55. In this case, the parasitic LCR circuit becomes unstable due to the negative capacitance in the second gate electrode 56, but oscillation can be suppressed by reduction of an inductance component or adjustment of a resistance component such as gate resistances. At a turn-off operation, since the gate electrode density has been substantially reduced by an amount corresponding to the second gate electrode 56, a turn-off time of the IEGT can be shortened and turn-off loss can be reduced.

In this embodiment, the first control signal applied to the first gate electrode 55 and the second control signal applied to the second gate electrode 56 may be turned on/off at the same timing. Even if the signals are turned on/off at the same timing, a turn-on operation and a turn-off operation of the IEGT can be performed with reduced influence of the negative capacitance by separating the first gate electrode 55 and the second gate electrode 56 with easiness of a negative capacitance occurrence. Thereby, a turn-on operation and a turn-off operation of the IEGT can be stabilized. In this case, the negative capacitance can be reduced and the rising of the ON-state voltage can be suppressed. At this time, a common control unit for the first and second gate electrodes 55, 56 may be provided in the controller 76, which is connected to the first and second terminals, instead of the control unit 76a for $G_1$ and the control unit 76b for $G_2$ provided for the respective gate electrodes.

The maximum voltage $V_{G2}$ (+) of the gate voltage applied to the second gate electrode can be set to be higher than the maximum voltage $V_{G1}$ (+) of the gate voltage applied to the first gate electrode. With such setting, it becomes possible to obtain a larger promotion effect of electron injection in an electrically conductive state. At this time, since the second gate electrode does not influence a turn-on operation of an element, even if a voltage larger than a voltage applied to the first gate electrode is applied to the second gate electrode, a sudden turn-on operation, increase in short-circuit current or the like is not caused. Therefore, the negative capacitance can be decreased and the ON-state voltage can be reduced.

Further, a voltage $V_{G2(-)}$ of a turn-off signal applied to the second gate electrode can be set to be lower than a voltage $V_{G1(-)}$ of a turn-off signal applied to the first gate electrode. With such setting, when an element is turn off, a p-type inversion layer is formed below the second gate electrode so that holes accumulated can be extracted rapidly. Thereby, a turn-off time can be further shortened and the turn-off loss can be further reduced.

Figure 21:
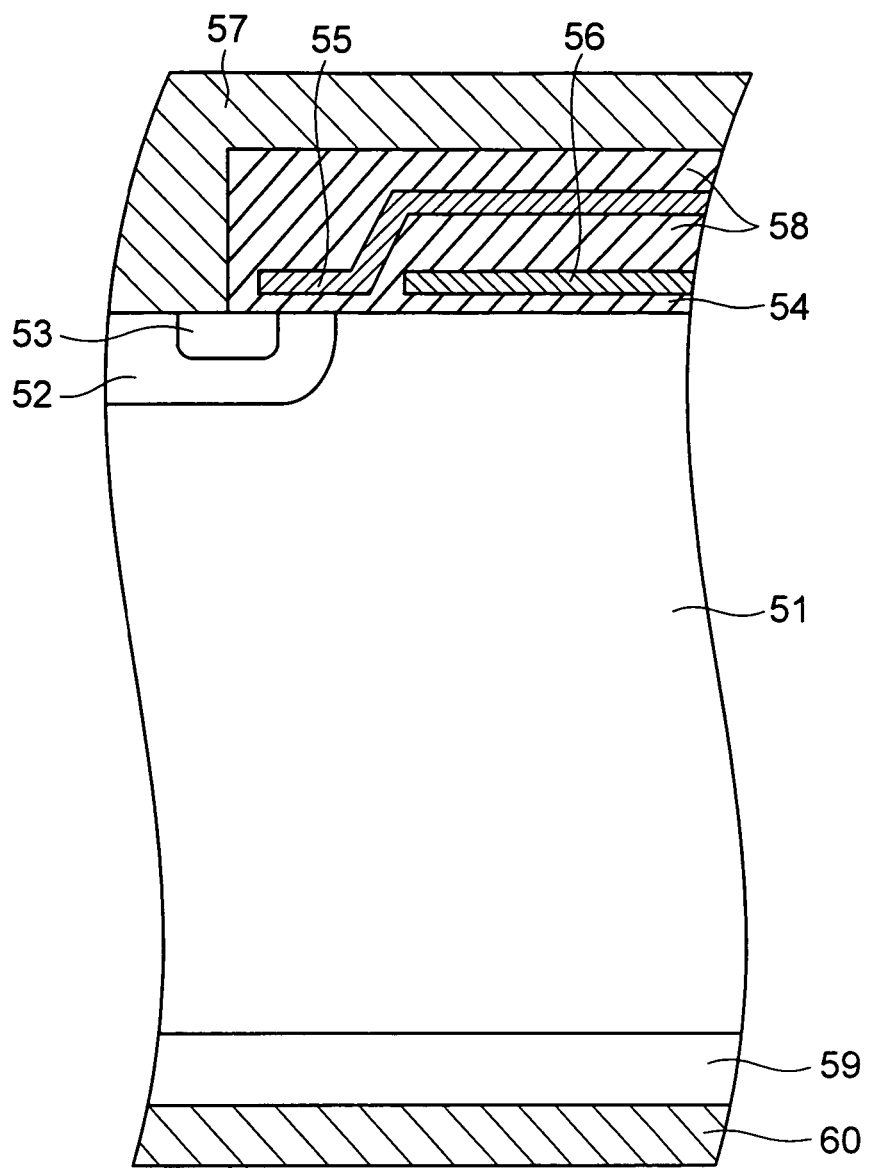
FIG. 21 is a sectional view of a semiconductor device according to a modification of the third embodiment of the present invention.

As a modification of this embodiment, as shown in FIG. 21, an end of the first gate electrode may extend on the second gate electrode of the semiconductor device shown in FIG. 16 via an insulating film. With such configuration, a resistance of the first gate electrode can be lowered.

Figure 22:
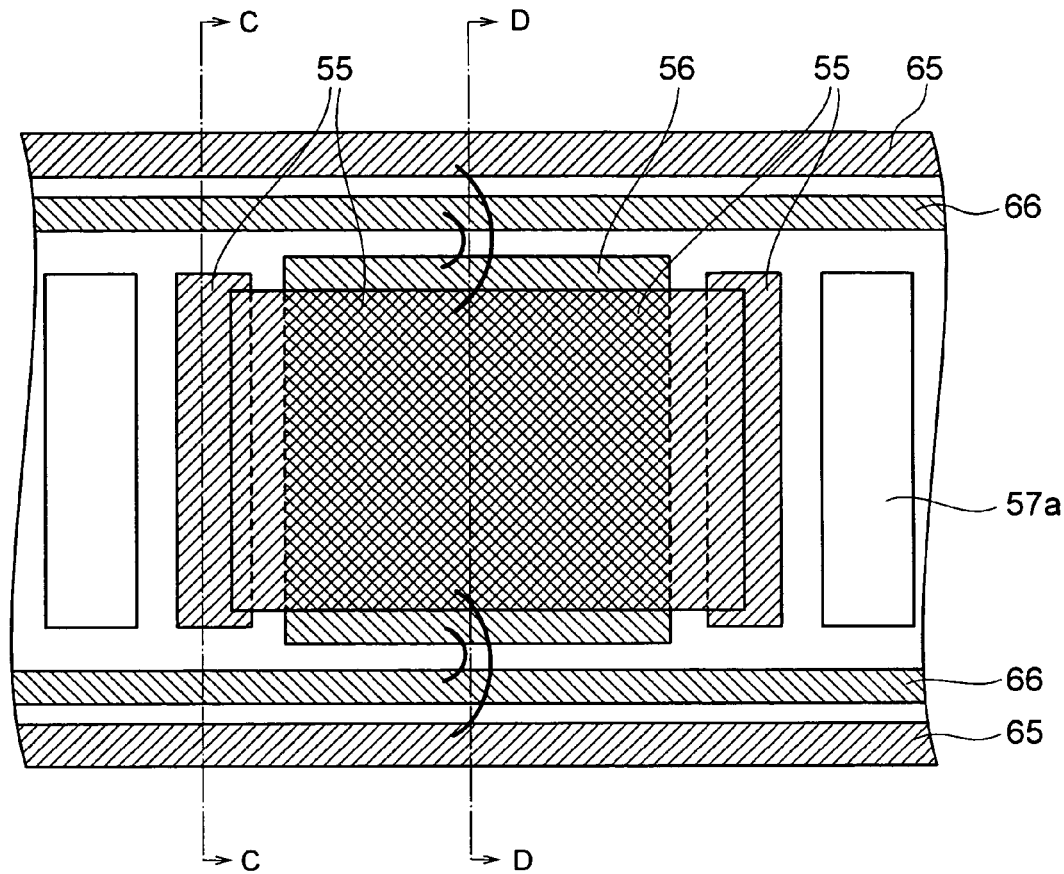
FIG. 22 is a plan view of a cell portion of the semiconductor device shown in FIG. 21.

FIG. 22 is a plan view of a cell portion of the semiconductor device shown in FIG. 21. Here, stacked first and second gate wires 65, 66 are respectively arranged on one end side and the other end side of the first and second gate electrodes 55, 56 in longitudinal directions thereof in a vertical direction thereof. The first gate electrode 55 and the second gate electrode 56 are respectively connected to the first and second gate wires 65, 66 to be separated from each other. A contact 57a for an emitter electrode is formed adjacent to the first gage electrode 55. The first gate wire 65 connected to the first gate electrode 55 and the second gate wire 66 connected to the second gate electrode 56 are stacked on each other through the insulating film 58, but they are arranged on an upper side and a lower side of the first and second gate electrodes 55, 56 on FIG. 23. Incidentally, in FIG. 22, the first gate wire 65 and the second gate wire 66 are depicted so as not to overlap each other in a shifted manner to each other.

Figure 23A:
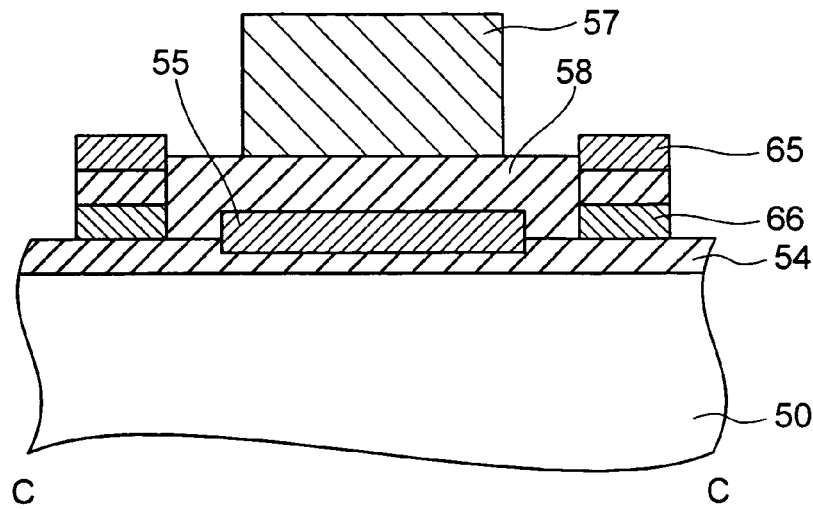
FIG. 23A and FIG. 23B are a sectional view of the semiconductor device shown in FIG. 22.
Figure 23B:
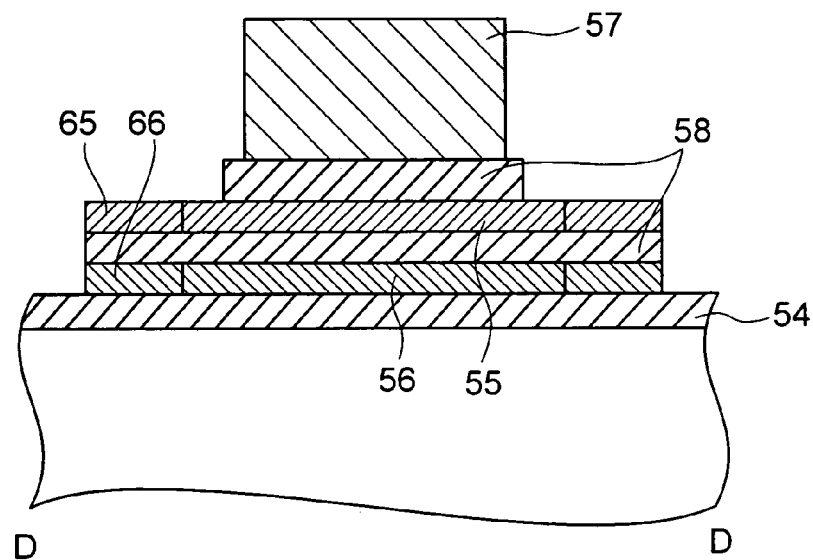

FIG. 23A and FIG. 23B are a sectional view of the semiconductor device shown in FIG. 22, taken along line C—C thereon and a sectional view thereof, taken along line D—D thereon. As shown in FIG. 23A, the first gate wire 65 is formed by drawing out an end of the first gate electrode 55. As shown in FIG. 23B, the second gate wire 66 is formed by drawing out an end of the second gate electrode 56. The second gate wire 66 is arranged on the first gate wire 65 via the insulating film 58.

With such a constitution, efficient arrangement of respective parts can be achieved. Since both the first and second gate wires 65 and 66 can be provided at both sides of the ends of the gate electrodes, fluctuation of a switching operation due to delay caused by a resistance in the gate electrodes (polysilicon) can be suppressed.

Such a constitution can be employed that the gate electrodes and the gate wires are connected mutually by extending ends of the gate electrodes or ends of the gate wires or they are connected mutually using connection members.

The first gate wires 65 and the second gate wires 66 are respectively formed on the upper side and the lower side of the first and second gate electrodes 55, 56 on FIG. 22 and the gate electrodes are connected to the wires on the both sides, but they may be connected to the wires on either side of both the sides on FIG. 22. Two sets of stacked first gate wire 25 and second gate wire 26 are formed such that each set corresponds to one of the upper side and lower side of the first and second gate electrodes 55, 56 on FIG. 22, but they may be formed at only one end side (either one of the upper side and the lower side on FIG. 22) of the first and second gate electrodes 55, 56 in their longitudinal directions.

(Fourth Embodiment)

Figure 24:
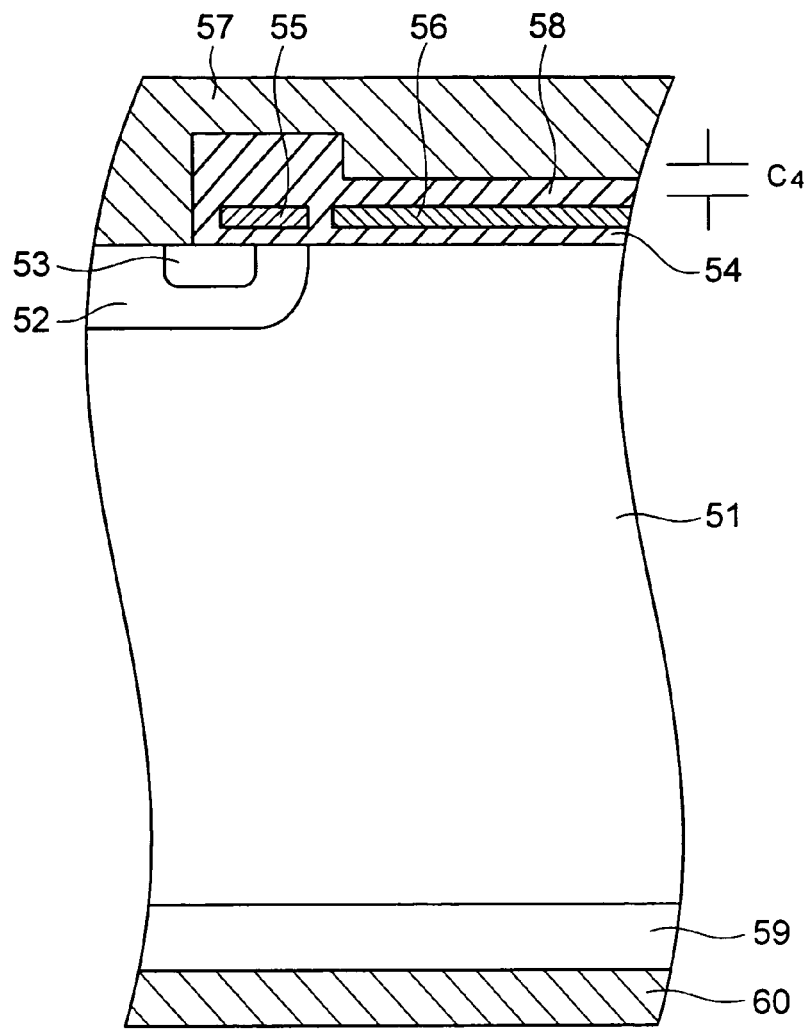
FIG. 24 is a sectional view of a semiconductor device according to a fourth embodiment of the present invention.

A semiconductor device according to a fourth embodiment of the present invention will be explained with reference to FIG. 24 and FIG. 25. Same portions or members as those in the third embodiment shown in FIGS. 16 to 23 are denoted by same reference numerals. FIG. 24 is a sectional view of an IEGT having a planar gate structure in this embodiment. In this embodiment, formation is made such that a thickness $L_2$ of a portion of the insulating film 58 on the second gate electrode ($G_2$) 56 is thinner than a thickness $L_1$ of a portion of the insulating film 58 on the first gate electrode ($G_1$) 55. That is, this means a constitution that a third capacitor $C_3$ has been substantially inserted between the second gate electrode 56 and the emitter electrode.

When the IEGT is turn on in a state of application of a high voltage on the collector electrode, holes injected from the p-type emitter layer are accumulated in an upper side of the n-type base layer. A negative capacitance occurs due to induction of negative charges in the gate electrode caused by the hole channel. Since an area of a portion of the first gate electrode 55 opposed to the n-type base layer is small, a negative capacitance is hard to occur in the first gate electrode 55. On the other hand, since holes accumulated below the second gate electrode 56 so that the hole channel is formed, a negative capacitance is easy to occur in the second gate electrode 56.

The first gate electrode 55 and the second gate electrode 56 are connected to different first and second gate wires (not shown) so as to be inputted with different control signals, respectively. The first and second gate wires are respectively connected to gate electrode taking-out sections (not shown).

Figure 25:
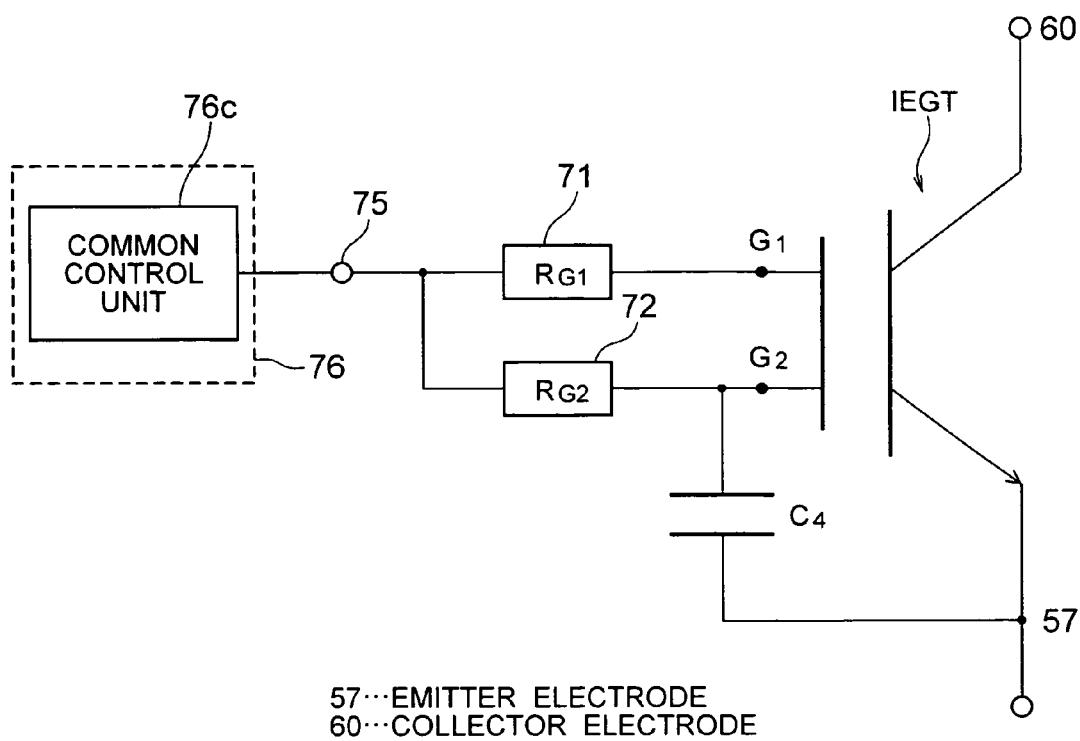
FIG. 25 is a circuit diagram of a semiconductor device including the IEGT shown in FIG. 24.

FIG. 25 is a circuit diagram of a semiconductor device including the IEGT shown in FIG. 24. As shown in FIG. 24, the third capacitor $C_3$ is inserted between the gate and the emitter at the portion of the second gate electrode 56 portion. The first gate electrode 55 and the second gate electrode 56 are respectively connected with a first gate resistor ($R_{G1}$) 71 and a second gate resistor ($R_{G2}$) 72. The first gate resistor 71 and the second gate resistor 72 are connected to a third terminal 75. In this embodiment, the first gate electrode 55 and the second gate electrode 56 are connected to the same or one terminal via the first and second gate resistors 71, 72. The third terminal 75 is connected to a controller 76 which controls gate voltages of the first and second gate electrodes 55, 56. The controller 76 is provided with a common control unit 76c for the first and second gate electrodes 55, 56, which control gate voltages of the first and second gate electrodes 55, 56.

In this embodiment, since an n-type channel is not formed at the second gate electrode 56 portion, the second gate electrode 56 does not contribute to a switching operation, and the IEGT operates owing to a channel in the first gate electrode 55 portion. For this reason, even if a negative capacitance occurs in the second gate electrode 56 and the gate voltage $V_{G2}$ at the second gate electrode 56 rises, such rising does not influence a turn-on operation of the IEGT so much.

In the embodiment, a third control signal in3 is applied to the first and second gate electrodes 55, 56 at timings similar to the times shown in FIG. 13. By separating the first gate electrode 55 and the second gate electrode 56 with easiness of negative capacitance occurrence from each other, influence of a negative capacitance can be reduced, where the IEGT can be turned on and turned off. Therefore, a turn-on operation and a turn-off operation of the IEGT can be stabilized. By separating the first gate electrode 55 and the second gate electrode 56 with easiness of negative capacitance occurrence from each other, the influence of a negative capacitance has been reduced and an effect for promoting electron injection is not suppressed differently from a formation of a thick gate insulating film on the n-type base layer.

Further, after an element is turned on by the first gate electrode 55, such a voltage as a positive voltage relative to the emitter voltage is applied to the second gate electrode 56, so that an n-type accumulation layer can be formed in an electrically conductive state and an ON-state voltage can be reduced.

When the first gate electrode is turned on, the density of the gate electrodes has been substantially reduced, a gate parasitic capacitance at a turn-on can be reduced. Thereby, the turn-on time of the IEGT can be shortened and turn-on loss can be reduced.

When the first gate electrode 55 is turned off, the density of the gate electrodes has been reduced substantially, so that a gate parasitic capacitance at a turn-off can be reduced. Thereby, the turn-off time of the IEGT can be shortened and turn-off loss can be reduced. Since the a rising rate of the second gate electrode is made slow and the magnitude of the voltage $V_{G-}$ rising due to the negative capacitance is reduced by inserting the third capacitor $C_3$, the turn-on operation and the turn-off operation of the IEGT is further stabilized. Furthermore, an interval from inputting a turn-on signal into the first gate electrode 55 to inputting a turn-on signal into the second gate electrode 56 can be shortened.

In the first to fourth embodiments, the examples of the IEGT with the trench gate structure and the IEGT with the planar gate structure have been explained, but the IEGT may be an IGBT or another MOS gate type bipolar semiconductor element.

(Fifth Embodiment)

Figure 26:
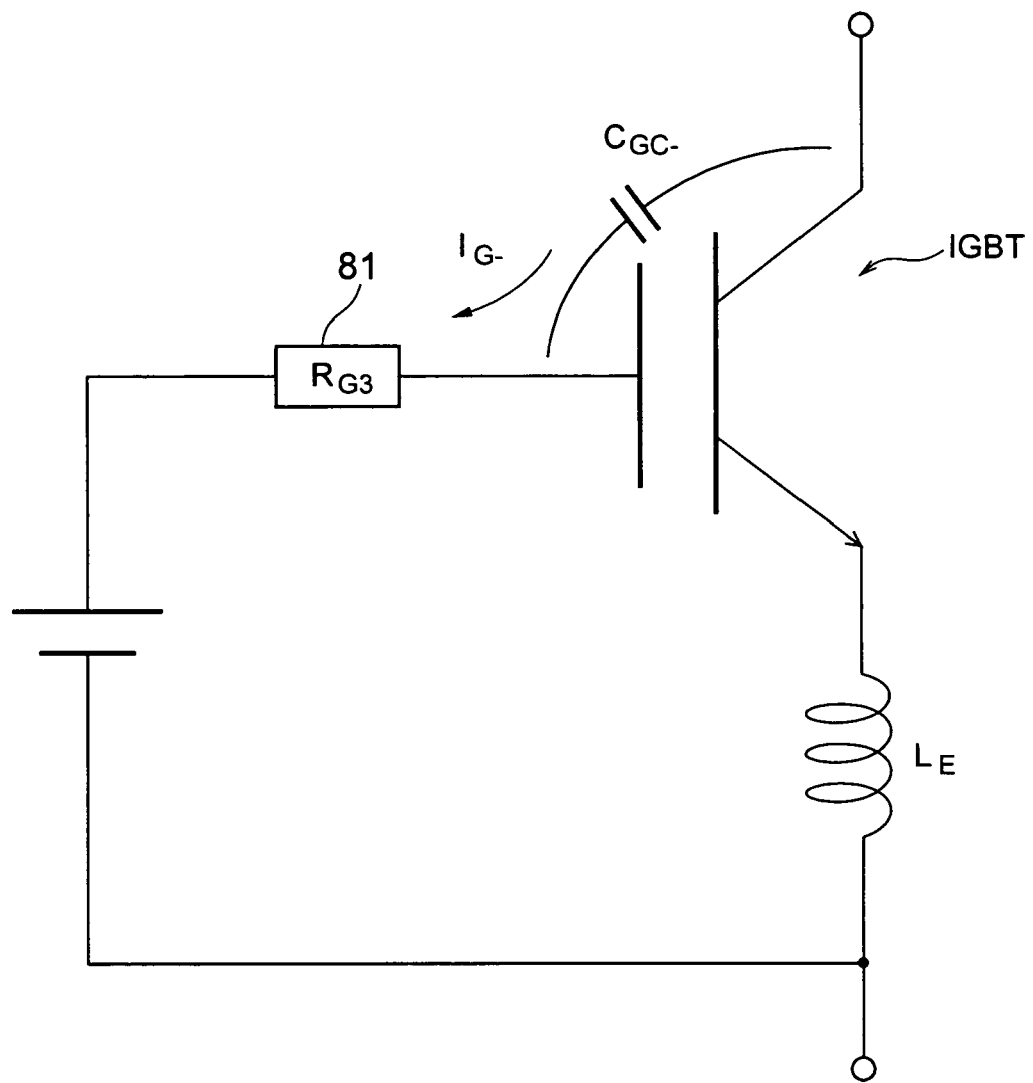
FIG. 26 is a circuit diagram of a semiconductor device according to a fifth embodiment of the present invention.

A semiconductor device according to a fifth embodiment of the present invention will be explained with reference to FIG. 26. FIG. 26 is a circuit diagram of a semiconductor device including an IGBT according to this embodiment. A sectional view of the IGBT is the same as that of an IGBT described in, for example, JP-A-10-321856 or JP-A-2000-101076. As shown in FIG. 26, an inductor $L_E$ is connected to an emitter electrode of the IGBT. When the IGBT is turned on, a current $I_{G-}$ flows in the IGBT due to a negative capacitance $C_{GC-}$ and a voltage drop $R_{G3}*I_{G-}$ occurs due to a third gate resistor ($R_{G3}$) 81. On the other hand, an induced electromotive force $L_E*dI/dt$ occurs in the inductor $L_E$ due to a current change at a turn-on. Therefore, influence due to the negative capacitance can be cancelled by selecting $R_{G3}$ and $L_E$ satisfying $R_{G3}*I_{G-} < L_E*dI/dt$. That is, an unstable turn-on operation such as an urgent turning-on operation of an element due to a rising of a gate voltage can be suppressed. Here, $I_{G-}$ can be obtained from a rising of the gate voltage due to the negative capacitance obtained when any $R_{G3}$ is selected and turning-on is made in a range of $L_E$ to 0. In this embodiment, the IGBT has been explained as the example, but the semiconductor element may be an IEGT or another MOS gate type bipolar semiconductor element.

What is claimed is:

1. A semiconductor device comprising:
   a first base layer of a first conductive type which has a first surface and a second surface;
   a second base layer of a second conductive type which is formed on the first surface;
   first and second gate electrodes which are formed by embedding an electrically conductive material into a plurality of trenches via gate insulating films, the plurality of trenches being formed such that bottoms of the trenches reach the first base layer, and the first and the second gate electrodes being electrically disconnected from each other;
   source layers of the first conductive type which are formed on a surface area of the second base layer so as to be adjacent to both side walls of the trench provided with the first gate electrode and so as to be adjacent to one side wall of the trench provided with the second gate electrode, respectively;
   an emitter layer of the second conductive type which is formed on the second surface;
   an emitter electrode which is formed on the second base layer and the source layers;
   a collector electrode which is formed on the emitter layer; and
   first and second terminals which are electrically connected to the first and the second gate electrodes, respectively, and the first and the second terminals being electrically disconnected from each other.

2. The semiconductor device according to claim 1 further comprising:
   a controller controlling the first and the second gate electrodes by inputting a turn-on signal or a turn-off signal to the first and the second gate electrodes.

3. The semiconductor device according to claim 2, wherein the controller controls to output the turn-on signal to the second gate electrode after outputting the turn-on signal to the first gate electrode.

4. The semiconductor device according to claim 3, wherein the controller, further, controls to output the turn-off signal to the first gate electrode after outputting the turn-off signal to the second gate electrode.

5. The semiconductor device according to claim 1 further comprising:
   a capacitor connected between the second gate electrode and the emitter electrode.

6. The semiconductor device according to claim 1, wherein the second gate electrode is formed that an end of the second gate electrode extends out of the trench;
   wherein the emitter electrode extends on a part of the second gate electrode via an insulating film, the part of the second gate electrode being out of the trench.

7. The semiconductor device according to claim 1, wherein a turn-on voltage applied to the first gate electrode is different from a turn-on voltage applied to the second gate electrode, and/or a turn-off voltage applied to the first gate electrode is different from a turn-off voltage applied to the second gate electrode.

8. The semiconductor device according to claim 7, wherein the turn-on voltage applied to the second gate electrode is higher than the turn-on voltage applied to the first gate electrode, and/or an absolute of the turn-off voltage applied to the second gate electrode is higher than an absolute of a turn-off voltage applied to the first gate electrode.

9. The semiconductor device according to claim 1, wherein one of the first gate electrodes is disposed between two of the second gate electrodes.

10. The semiconductor device according to claim 1, wherein one of the first gate electrodes and two of the second gate electrodes form a unit cell, a plurality of the unit cells are arranged repeatedly.

11. A semiconductor device comprising:
    a first base layer of a first conductive type which has a first surface and a second surface;
    a second base layer of a second conductive type which is formed on the first surface;
    first and second gate electrodes which are formed by embedding an electrically conductive material into a plurality of trenches via gate insulating films, the plurality of trenches being formed such that bottoms of the trenches reach the first base layer;
    source layers of the first conductive type which are formed on a surface area of the second base layer so as to be adjacent to both side walls of the trench provided with the first gate electrode and so as to be adjacent to one side wall of the trench provided with the second gate electrode, respectively;

an emitter layer of the second conductive type which is formed on the second surface;

an emitter electrode which is formed on the second base layer and the source layers;

a collector electrode which is formed on the emitter layer; and a terminal connected electrically to the first and the second gate electrodes, wherein a capacitance between the first gate electrode and the emitter electrode is different from a capacitance between the second gate electrode and the emitter electrode.

12. The semiconductor device according to claim 11 further comprising:

a controller controlling the first and the second gate electrodes by inputting a turn-on signal or a turn-off signal through the terminal to the first and second gate electrodes.

13. The semiconductor device according to claim 11 further comprising:

a capacitor connected between the second gate electrode and the emitter electrode.

14. The semiconductor device according to claim 11, wherein the second gate electrode is formed that an end of the second gate electrode extends out of the trench;

wherein the emitter electrode extends on a part of the second gate electrode via an insulating film, the part of the second gate electrode being out of the trench.

15. The semiconductor device according to claim 11, wherein one of the first gate electrodes is disposed between two of the second gate electrodes.

16. The semiconductor device according to claim 11, wherein one of the first gate electrode and two of the second gate electrodes form a unit cell, a plurality of the unit cells are arranged repeatedly.

* * * * *